(12) United States Patent
Mullen et al.

(10) Patent No.: US 12,055,706 B2
(45) Date of Patent: Aug. 6, 2024

(54) METHODS AND SYSTEMS FOR FIBER SCANNERS WITH CONTINUOUS BOND LINES

(71) Applicant: Magic Leap, Inc., Plantation, FL (US)

(72) Inventors: Emma Rae Mullen, Seattle, WA (US); Mina Rohani, Seattle, WA (US); Benjamin John Kuehn, Seattle, WA (US); Abhijith Rajiv, Seattle, WA (US); Brian T. Schowengerdt, Seattle, WA (US); Sarah Colline McQuaide, Seattle, WA (US)

(73) Assignee: Magic Leap, Inc., Plantation, FL (US)

( * ) Notice: Subject to any disclaimer, the term of this patent is extended or adjusted under 35 U.S.C. 154(b) by 746 days.

(21) Appl. No.: 17/127,538

(22) Filed: Dec. 18, 2020

(65) Prior Publication Data
US 2021/0223542 A1   Jul. 22, 2021

Related U.S. Application Data

(63) Continuation of application No. PCT/US2019/038214, filed on Jun. 20, 2019.

(60) Provisional application No. 62/687,444, filed on Jun. 20, 2018.

(51) Int. Cl.
| G02B 26/10 | (2006.01) |
| H02N 2/00 | (2006.01) |
| H02N 2/02 | (2006.01) |
| H02N 2/04 | (2006.01) |
| H02N 2/06 | (2006.01) |
| H10N 30/045 | (2023.01) |

(52) U.S. Cl.
CPC .......... *G02B 26/103* (2013.01); *H02N 2/028* (2013.01); *H02N 2/04* (2013.01); *H02N 2/062* (2013.01); *H02N 2/22* (2013.01); *H10N 30/045* (2023.02)

(58) Field of Classification Search
CPC .............................................. G02B 2006/0098
See application file for complete search history.

(56) References Cited

U.S. PATENT DOCUMENTS

| 7,447,415 B2 * | 11/2008 | Melville ............. G02B 26/103 |
| | | 385/136 |
| 9,389,424 B1 | 7/2016 | Schowengerdt |
| 9,445,063 B2 * | 9/2016 | Kim ..................... H04N 9/3129 |
| 10,254,483 B2 | 4/2019 | Schowengerdt et al. |
| 2007/0273930 A1 | 11/2007 | Berier et al. |
| 2009/0026888 A1 | 1/2009 | Melville |

(Continued)

FOREIGN PATENT DOCUMENTS

WO    2019246380 A1   12/2019

OTHER PUBLICATIONS

PCT/US2019/038214, "International Preliminary Report on Patentability", Dec. 30, 2020, 14 pages.

(Continued)

*Primary Examiner* — Rhonda S Peace
(74) *Attorney, Agent, or Firm* — KILPATRICK TOWNSEND & STOCKTON LLP

(57) ABSTRACT

A fiber scanning system includes a fiber optic element having an actuation region and a motion actuator mechanically coupled to the fiber optic element. A continuous bond line is present between the actuation region and the motion actuator. The fiber scanning system also includes a retention collar mechanically coupled to the motion actuator.

16 Claims, 17 Drawing Sheets

(56) References Cited

U.S. PATENT DOCUMENTS

| | | | |
|---|---|---|---|
| 2009/0218641 | A1 | 9/2009 | Melville et al. |
| 2013/0257222 | A1 | 10/2013 | Funakubo |
| 2014/0114131 | A1* | 4/2014 | Sakai .................. A61B 1/0011 |
| | | | 600/182 |
| 2015/0010878 | A1 | 1/2015 | Seibel et al. |
| 2015/0205050 | A1 | 7/2015 | Funakubo et al. |
| 2016/0357005 | A1* | 12/2016 | Okita ................. G02B 23/2469 |
| 2017/0102537 | A1* | 4/2017 | Fujiwara ................ A61B 1/07 |
| 2018/0180812 | A1 | 6/2018 | Schowengerdt et al. |
| 2021/0223542 | A1* | 7/2021 | Mullen ................... H02N 2/04 |

OTHER PUBLICATIONS

PCT/US2019/038214, "International Search Report and Written Opinion", Nov. 5, 2019, 11 pages.
PCT/US2019/038214, "Invitation to Pay Additional Fees and, Where Applicable, Protest Fee", Aug. 27, 2019, 2 pages.

* cited by examiner

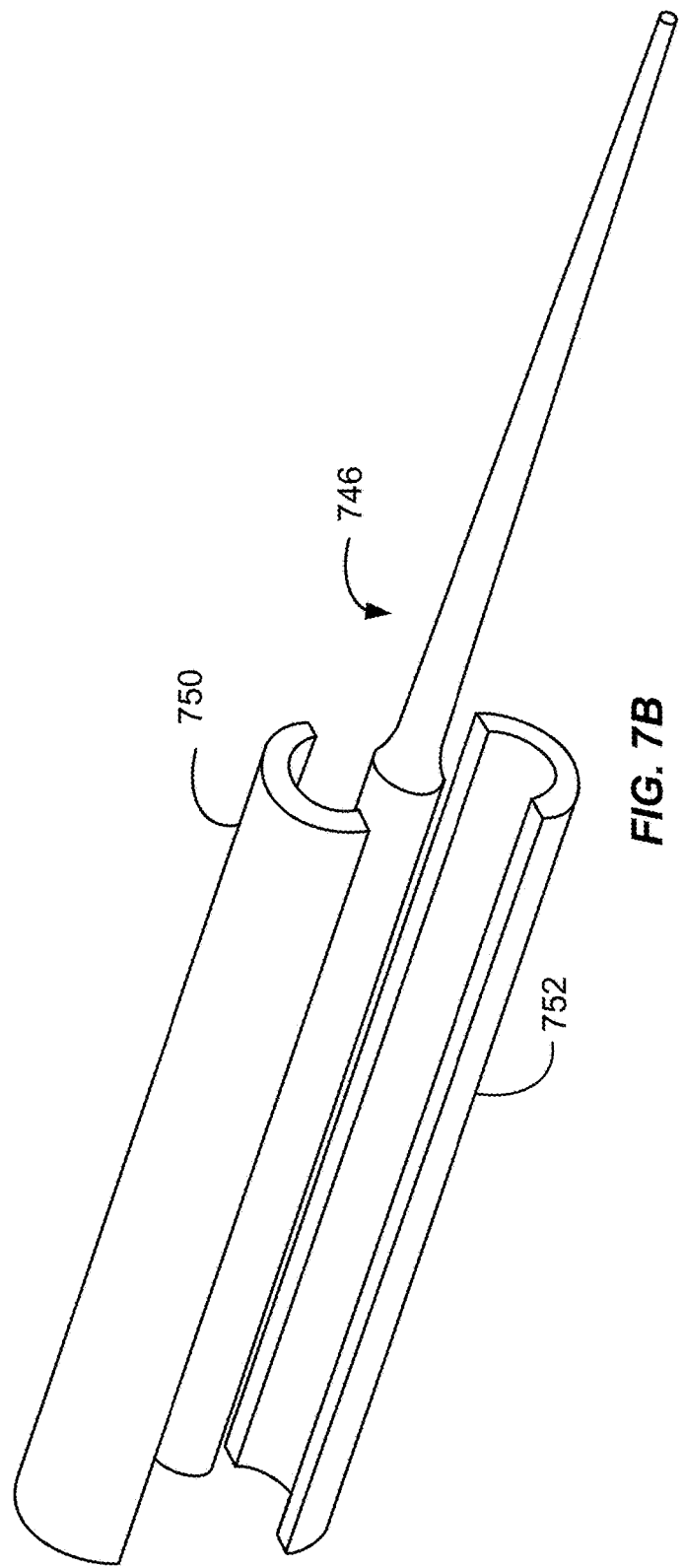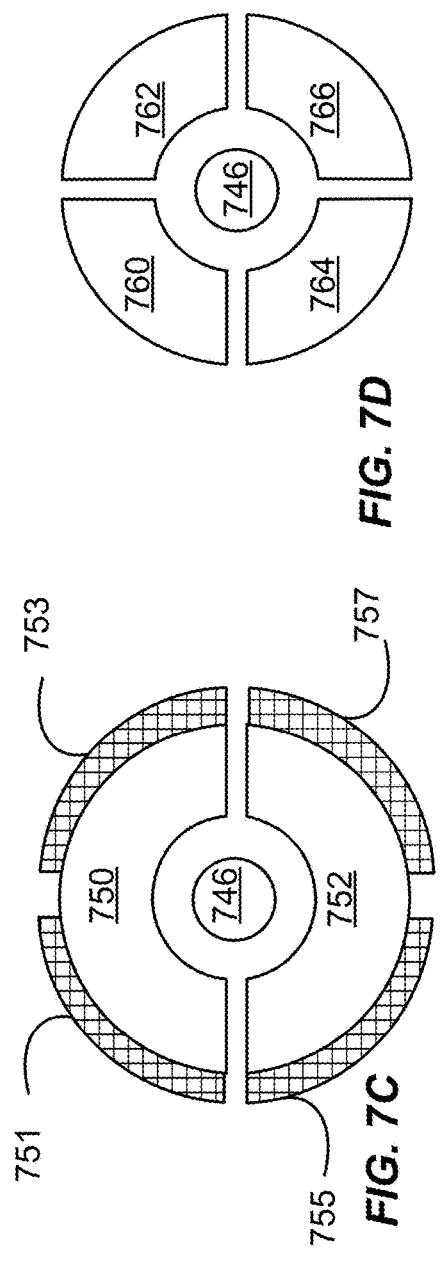

1121

1122

METHODS AND SYSTEMS FOR FIBER SCANNERS WITH CONTINUOUS BOND LINES

CROSS-REFERENCES TO RELATED APPLICATIONS

This application is a continuation of International Patent Application No. PCT/US2019/038214, filed Jun. 20, 2019, entitled "METHODS AND SYSTEMS FOR FIBER SCANNERS WITH CONTINUOUS BOND LINES," which claims the benefit of and priority to U.S. Provisional Patent Application No. 62/687,444, filed Jun. 20, 2018, entitled "METHODS AND SYSTEMS FOR FIBER SCANNERS WITH CONTINUOUS BOND LINES," the contents of which are hereby incorporated by reference in their entirety.

BACKGROUND OF THE INVENTION

Modern computing and display technologies have facilitated the development of systems for so called "virtual reality" or "augmented reality" experiences, wherein digitally reproduced images or portions thereof are presented to a viewer in a manner wherein they seem to be, or may be perceived as, real. A virtual reality, or "VR," scenario typically involves presentation of digital or virtual image information without transparency to other actual real-world visual input; an augmented reality, or "AR," scenario typically involves presentation of digital or virtual image information as an augmentation to visualization of the actual world around the viewer.

Despite the progress made in these display technologies, there is a need in the art for improved methods and systems related to augmented reality systems, particularly, display systems.

SUMMARY OF THE INVENTION

The present invention relates generally to methods and systems for fiber scanners for projection display systems. More particularly, embodiments of the present invention provide methods and systems for fabricating fiber optic elements that utilize a continuous bond line between the fiber optic element and a motion actuator. The invention is applicable to a variety of applications in computer vision and image display systems.

According to an embodiment of the present invention, a fiber scanning system is provided. The fiber scanning system includes a fiber optic element having an actuation region and a motion actuator mechanically coupled to the fiber optic element. A continuous bond line is present between the actuation region and the motion actuator. The fiber scanning system also includes a retention collar mechanically coupled to the motion actuator.

According to another embodiment of the present invention, a method of fabricating a fiber scanning system is provided. The method includes forming a set of piezoelectric elements and coating an interior surface and an exterior surface of each of the set of piezoelectric elements with a first conductive material. The method also includes providing a fiber optic element having an actuation region and coating the actuation region of the fiber optic element with a second conductive material. The first conductive material and the second conductive material may be a same material, for example, a metal layer including chrome. As an example, the first conductive material and the second conductive material can include a metal layer, for example, chrome, nickel, aluminum, gold, or combinations thereof.

The method further includes joining the interior surfaces of the set of piezoelectric elements to the actuation region of the fiber optic element, poling the piezoelectric elements, and forming electrical connections to the exterior surface of each of the set of piezoelectric elements and the fiber optic element.

In some embodiments, at least one of the first conductive material or the second conductive material comprises a pattern. The pattern can be formed by printing, lithograph, or deposition of discrete electrodes on the exterior surface of the set of piezoelectric elements. Additionally, the pattern can be formed by separating the first conductive material coated on the interior surface of the set of piezoelectric elements from one or more metallization regions bonding the set of piezoelectric elements. Furthermore, the pattern can be formed by metallizing and then removing a portion of the metallization via at least one of ablation, milling, or etching.

Numerous benefits are achieved by way of the present invention over conventional techniques. For example, embodiments of the present invention provide methods and systems that can be used to fabricate fiber scanners that can be integrated into fiber scanning display systems. Fiber optic elements described herein provide higher deflection and higher Q factors than available using conventional techniques. The geometry and mating of parts reduce the assembly time in comparison with conventional techniques, as well as providing a more controllable assembly as a result of the smaller volumes of adhesives (e.g., epoxy) used in embodiments of the present invention. Embodiments of the present invention provide better stability and less degradation over time, are easier to manufacture than conventional systems, provide a reduction in the number of parts to be assembled and, as a result, assembly costs, and enable self-alignment of components during assembly, which is highly desirable since alignment solutions are very important in the area of micro-optics. These and other embodiments of the invention, along with many of its advantages and features, are described in more detail in conjunction with the text below and attached figures.

BRIEF DESCRIPTION OF THE DRAWINGS

FIG. 7B is an exploded perspective view of two piezoelectric tube sections with a hemispherical cross section and a fiber optic element according to an embodiment of the present invention.

FIG. 7C is an exploded cross-sectional view of two piezoelectric tube sections with a hemispherical cross section and a fiber optic element according to an embodiment of the present invention.

FIG. 7D is an exploded cross-sectional view of four quartered piezoelectric tube sections and a fiber optic element according to an embodiment of the present invention.

DETAILED DESCRIPTION OF SPECIFIC EMBODIMENTS

Embodiments of the present invention relate to methods and systems for fabricating elements for fiber scanning display systems.

Figure 1:
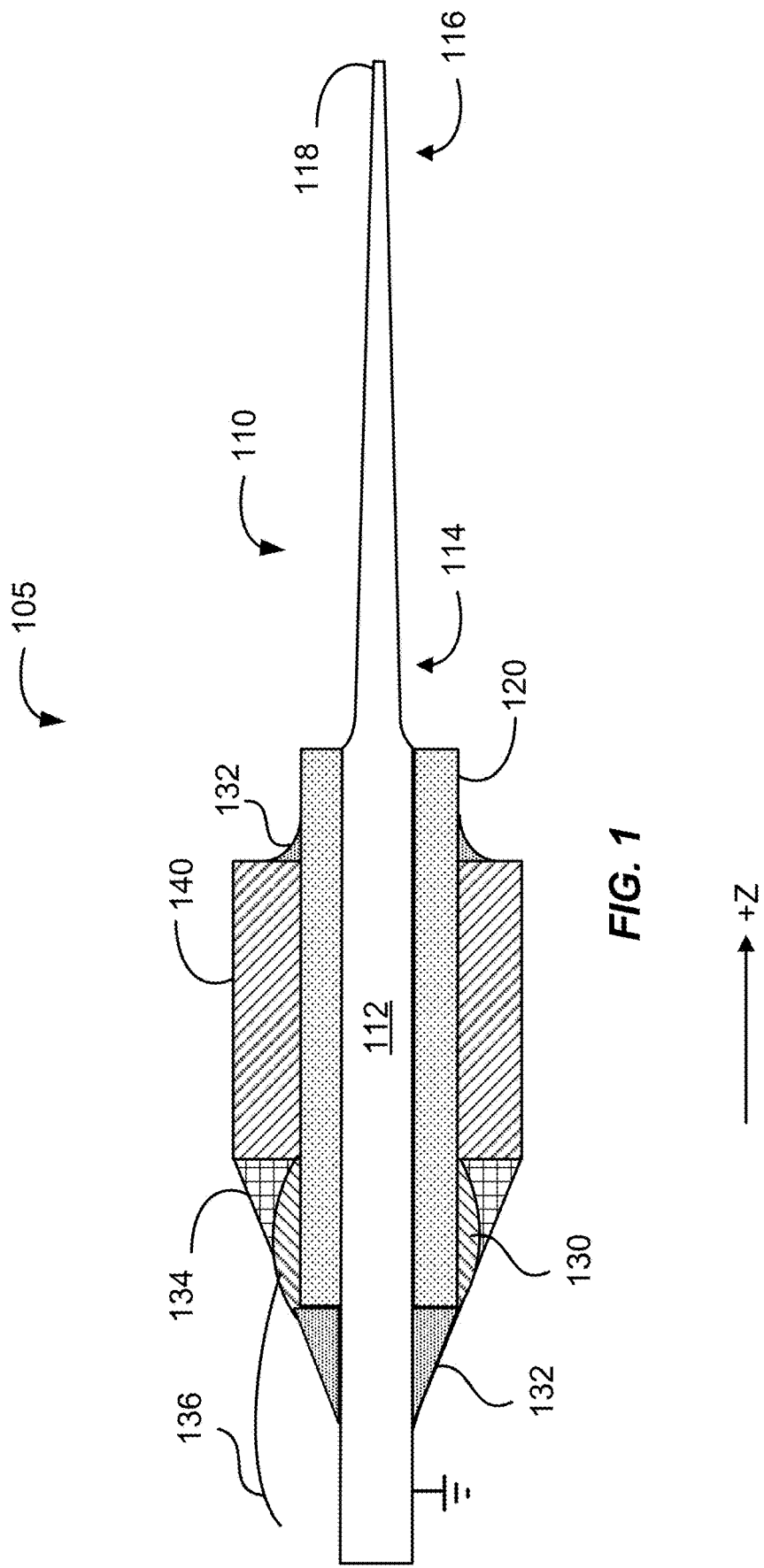
FIG. 1 is a simplified side view illustrating a continuous bond line fiber scanner according to an embodiment of the present invention.

FIG. 1 is a simplified side view illustrating a continuous bond line fiber scanner according to an embodiment of the present invention. The fiber scanner illustrated in FIG. 1 can be part of a fiber scanning projection display system. Referring to FIG. 1, the fiber scanner 105 includes a fiber optic element 110 that is mechanically coupled to a motion actuator 120. Additional disclosure related to an embodiment the motion actuator 120 is provided in relation to FIG. 2 below. It will be appreciated that the dimensions of the various components illustrated in FIG. 1 are not to scale.

Referring to FIG. 1, light is injected into the fiber optic element such that light waveguided by the fiber propagates in the positive z-direction. Fiber optic element 110 can be referenced by several regions or portions, including an actuation region 112 in which the fiber optic element is positioned between elements of the motion actuator, an extension region 114 that extends from the motion actuator 120 along the direction of propagation (i.e., the positive z-direction), and a light emission region 116 including light emission tip 118. Accordingly, light propagating through the fiber optic element 110, is emitted through the light emission tip 118. As described herein, actuation of the motion actuator 120 can result in the light emission tip 118 moving in one, two, or three dimensions, for example, sweeping out a spiral shaped scan pattern.

As illustrated in FIG. 1, the fiber optic element 110 is tapered in some embodiments such that the extension region 114 is characterized by a first diameter and the light emission region 116 including light emission tip 118 is characterized by a second diameter that is less than the first diameter as the fiber tapers towards the tip. The tapering can be continuous (i.e., constantly decreasing diameter as a function of position) in some embodiments or non-continuous in other embodiments.

As illustrated in FIG. 1, the materials of the motion actuator, e.g., the piezoelectric material, and the fiber optic element, e.g., glass, are in direct mechanical contact. In other embodiments, substantial mechanical contact is provided by the insertion of an interface layer between the motion actuator and the fiber optic element as a result of the continuous bond line. In these embodiments, the fiber optic element is slightly smaller in diameter than the motion actuator barrel, enabling a thin layer of adhesive to be utilized to join the fiber optic element to the motion actuator. In these embodiments, substantial mechanical contact is provided by the insertion of the interface layer between the motion actuator and the fiber optic element. The interface layer can be disposed between the actuation region 112, and the motion actuator as well as between the extension region 114 and the motion actuator as well as at other portions of the motion actuator. As examples, the interface layer can include at least one of a metal-to-metal bond, frit glass, adhesives such as epoxy, or the like. In one embodiment, frit glass, for example, in the form of a preform, is placed at the interface between the motion actuator and the fiber, for example, to the right of the end of the motion actuator. The frit glass, which can have different layers making up the preform, can then be reflowed into the interface between the coupling region and the projection region. After reflowing, the frit glass may be present both in the interface and outside the motion actuator, forming a seal around the fiber where it exits the motion actuator. As an example, a ring of material could be placed around the fiber at the right side of the motion actuator. Upon heating, the material could flow into the interface region between actuation region 112 and motion actuator 120 and form a stress relief element surrounding the fiber. When used as an interface material, epoxy is a damping material, which can provide benefits in some implementations. Although frit glass is discussed herein, embodiments of the present invention are not limited to the use of this material for bonding and other materials, including a variety of adhesives such as epoxy, can be utilized.

Figure 2:
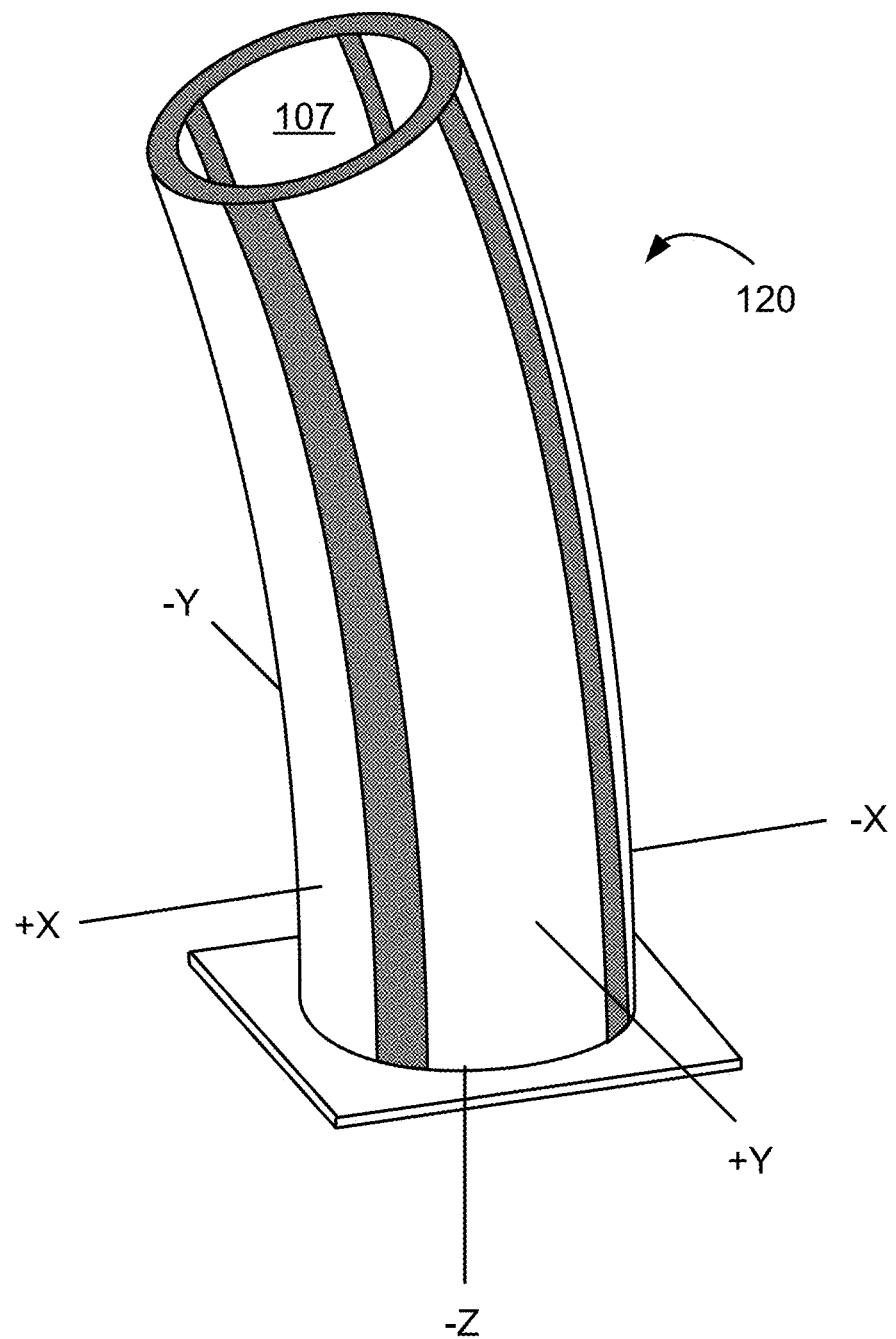
FIG. 2 is a simplified perspective view of a piezoelectric motion actuator according to an embodiment of the present invention.

FIG. 2 is a simplified perspective view of a piezoelectric motion actuator according to an embodiment of the present invention. The piezoelectric motion actuator illustrated in FIG. 2 includes four actuation inputs (+X, −X, +Y, and −Y), which allow the piezoelectric motion actuator to move in the x, y, and z directions. The fiber optic element 110 illustrated in FIG. 1 passes through the orifice 107 and by actuation of the four actuation inputs, the fiber optic element can be scanned in two dimensions. In FIG. 2, contraction of the +X actuation input and expansion of the −X actuation input causes the piezoelectric motion actuator to tilt toward the +X axis. Although the motion illustrated in FIG. 2 is in two dimensions (i.e., along planes defined by the x-axis and y-axis), embodiments of the present invention can also expand or contract all four actuation inputs in unison to contract/expand along the z-axis. Thus, embodiments of the present invention provide for both motion in the x-direction and the y-direction, as well as the use of cylindrical actuators that compress/expand in the z-direction.

The motion actuator illustrated in FIG. 2 is characterized by an orifice 107, also referred to as an internal orifice, characterized by a diameter, for example, 200 µm. In some embodiments, the cross section of the motion actuator is constant as a function of the longitudinal position, for example, the position along the z-axis. In these embodiments, the diameter, i.e., the orifice dimension, will be constant as a function of the z-direction.

Referring once again to FIG. 1, the actuation region 112 of the fiber optic element is mechanically coupled to the motion actuator 120 according to embodiments of the present invention. In the embodiment illustrated in FIG. 1, the internal orifice of the motion actuator is characterized by a cylindrical profile defined by an internal diameter between 200 and 205 µm and the fiber optic element 110 has an actuation region 112 that is substantially cylindrical and defined by an outer diameter substantially equal to the internal diameter of the motion actuator, for example, between 198 µm and 199 µm. In other embodiments, the internal diameter of the motion actuator and the outer diameter of the fiber optic element are larger or smaller depending on the particular application. A bonding method, which can include use of an adhesive that can be used to fill any gap existing between the outer diameter of the fiber optic element and the inner diameter of the motion actuator, can be utilized to bond the fiber optic element to the motion actuator. The fiber optic element, as a result, completely fills the motion actuator barrel to provide a rugged mechanical connection and can be a press-fit member in some embodiments. In the embodiment illustrated in FIG. 1, the materials of the motion actuator, e.g., the piezoelectric material, and the fiber optic element, e.g., glass, are in direct mechanical contact because of the substantially matched sizes. Because the outer diameter of the fiber optic element is substantially the same as the inner diameter of the motion actuator, a continuous bond line is formed in the actuation region 112 of the fiber scanner.

As illustrated in FIG. 1, the motion actuator 120 is mechanically constrained by retention collar 140, which surrounds the motion actuator. The retention collar can be made from suitable materials characterized by mechanical rigidity, including alumina, zirconia, other hard ceramics, glass, or the like. A first adhesive 132 is utilized to bond the fiber optic element to the motion actuator as illustrated by first adhesive 132 adjacent the proximal end (the left side in FIG. 1 at a lesser z-dimension) of the retention collar 140. In some embodiments, the first adhesive 132 is also used to bond the retention collar 140 to the motion actuator, as illustrated by first adhesive 132 adjacent the distal end (the right side in FIG. 1 at a greater z-dimension) of the retention collar 140. For example, the first adhesive can be characterized by high lap shear and either a high or low glass transition temperature.

A metal contact 130 is electrically connected to one or more electrodes (not shown) present on the exterior surface of the motion actuator. In the embodiments illustrated in FIG. 1, wire bond 136 provides for electrical access to metal contact 130 and the underlying electrodes that are electrically connected to the electrical conductor on the outer surface of the fiber optic element and, optionally, the electrical conductor on the inner surface of the motion actuator. In other embodiments, rather than a wire bond, an electrical connection can be made directly to a flexible electrical connector, reducing the need to manage isolated wires. The flexible electrical connector can be bonded to the inner electrode. A second adhesive 134 is utilized to solidify the contact with the retention collar and to fully or partially encapsulate metal contact 130 in order to reinforce the adhesion of the metal contact 130 to the outer surface of the motion actuator. In some embodiments, the second adhesive is optional. As discussed more fully herein, the exterior surface of fiber optic element 110 can be metallized, providing an electrical contact for the illustrated ground. As an example, wires can be soldered to the metallization on the exterior surface of the fiber optic element or a flexible contact structure could be soldered to the exterior surface. Thus, by applying a bias to wire bond 136, an electric field can be placed across the motion actuator, which is a piezoelectric actuator in some embodiments.

According to some embodiments of the present invention, the thickness of the walls of the motion actuator can be reduced as a benefit provided by the continuous bond line between the interior surfaces of the motion actuator and the periphery of the fiber optic element. Because the structure of the fiber optic element will provide mechanical support for the fiber scanner, the thickness of the walls of the motion actuator can be reduced, thereby providing cost savings, as well as reductions in system weight and size. In implementations in which the motion actuator utilizes piezoelectric materials, reductions in the piezoelectric wall thickness will result in higher piezoelectric efficiency as the voltage traverses a shorter distance. One of ordinary skill in the art would recognize many variations, modifications, and alternatives.

Figure 3A:
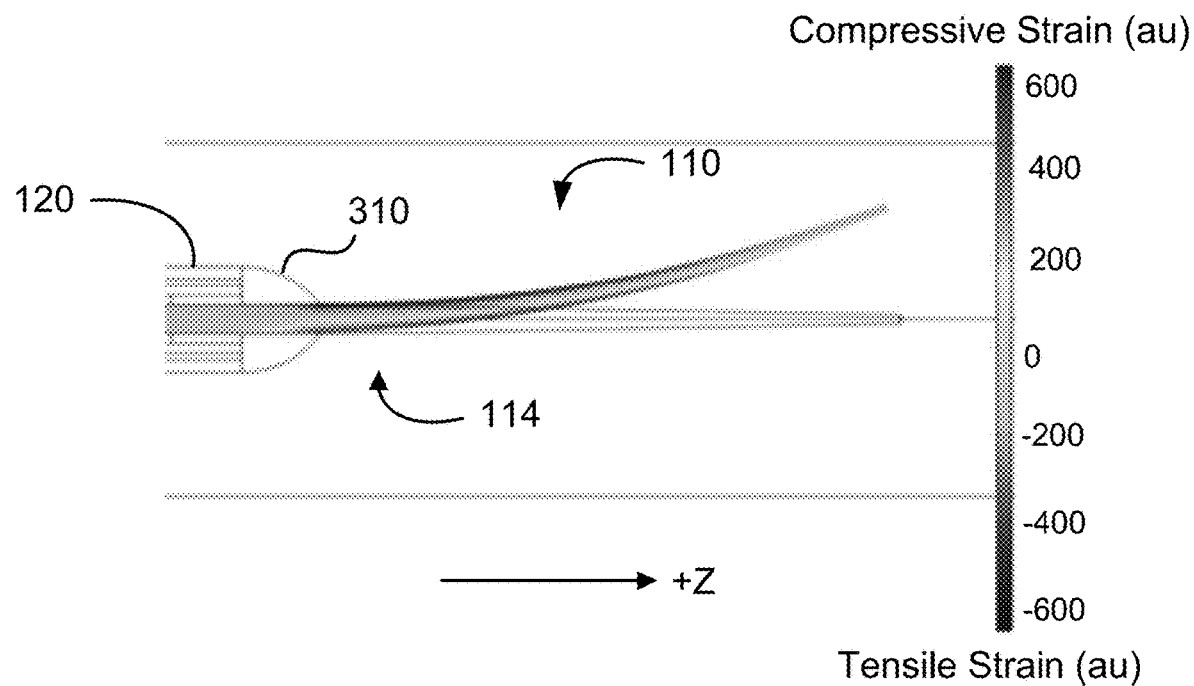
FIG. 3A is a simplified stress diagram of a portion of a fiber optic element in a conventional fiber scanner.

FIG. 3A is a simplified stress diagram of a portion of a fiber optic element in a conventional fiber scanner. As illustrated in FIG. 3A, an epoxy bond 310 is utilized at the joint between the end of the motion actuator 120 and the extension region 114 of the fiber optic element 110. The surface contact between the epoxy bonding material and the sides of the fiber optic element is sufficient to ensure a strong mechanical coupling. As a result, the stress, illustrated as compressive stress on the top side of the fiber optic element and tensile stress on the bottom side of the fiber optic element, is not only distributed in the fiber optic element, but also present in the epoxy bond 310. Significantly, the illustrated tensile and compressive stress is located in a portion of the fiber optic element that is moving during oscillation. As a result of the time varying compressive and tensile stresses at the interface of the fiber optic element and the epoxy bond as the fiber optic element oscillates, the reliability of the epoxy bond is adversely impacted, thereby reducing system reliability.

Figure 3B:
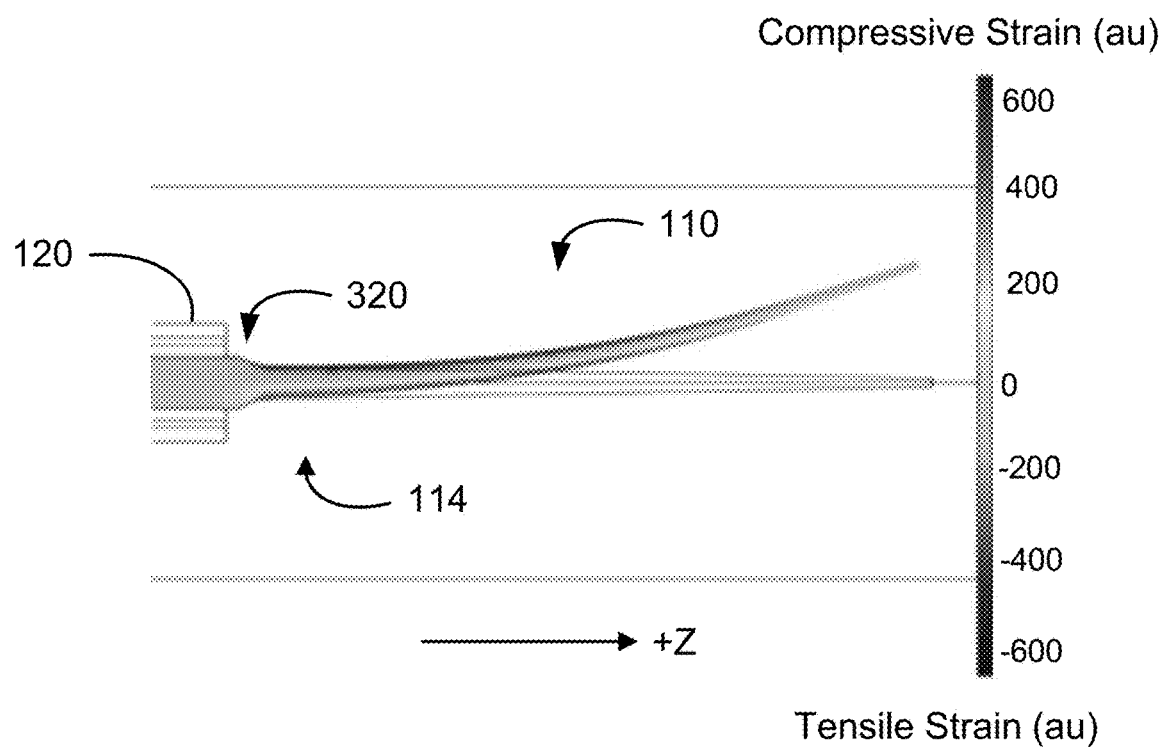
FIG. 3B is a simplified stress diagram of a portion of a fiber optic element in a fiber scanner according to an embodiment of the present invention.

FIG. 3B is a simplified stress diagram of a portion of a fiber optic element in a fiber scanner according to an embodiment of the present invention. In this embodiment, the tapering of the fiber optic element begins at a position 320 external to the motion actuator, although this is not required by the present invention. An adhesive can be present between the fiber optic element and the inner surfaces of the motion actuator as discussed in relation to FIG. 1. However, in the fiber scanner in FIG. 3B, the adhesive is located at a portion of the fiber optic element that is much stiffer and thus moving less than in the case of fiber scanner in FIG. 3A. Comparing FIGS. 3A and 3B, the compressive and tensile stress is confined to the materials of the fiber optic element, which are capable of sustaining the illustrated levels of stress for the expected lifetime of the fiber scanner and providing high reliability. Embodiments of the present invention are able to reduce or eliminate the epoxy bond illustrated in FIG. 3A as a result of the continuous bond line that is formed between the interior surfaces of the motion actuator and the periphery of the fiber optic element, thereby providing sufficient mechanical attachment to reliably adhere the fiber optic element to the motion actuator.

Figure 4:
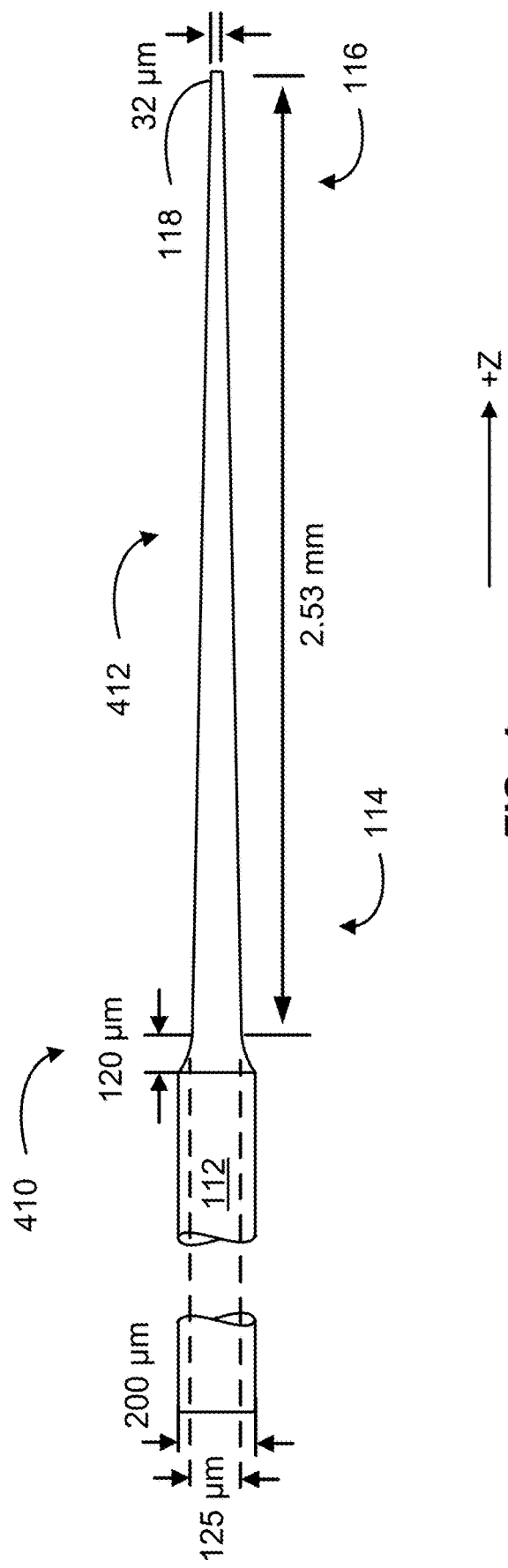
FIG. 4 is a simplified cross-sectional view of a fiber optic element utilized in a fiber scanner according to an embodiment of the present invention.

FIG. 4 is a simplified cross sectional view of a fiber optic element utilized in a fiber scanner according to an embodiment of the present invention. In an embodiment, the outer diameter of the fiber optic element is 200 µm, although this is not required by the present invention, and other outer diameters can be utilized. For purposes of comparison, the actuation region 112, the extension region 114, and the light emission region 116 are illustrated in FIG. 4. The extension region 114 of the fiber optic element includes a first tapered region 410 and a second tapered region 412. Together, the first tapered region and the second tapered region result in the outer diameter of the extension region and light delivery region decreasing with increasing z-dimension. In the embodiment illustrated in FIG. 4, the tapering is linear in each of the extension region and the light delivery region, although this is not required by the present invention and the profile of the tapering can be non-linear as appropriate to the particular application.

Referring to FIG. 4, the first tapered region 410 has a longitudinal (z-direction) length of 120 µm, over which the outer diameter of the fiber optic element decreases from 200 µm to 125 µm. The taper profile is generally non-linear, with a rapidly decreasing diameter as a function of longitudinal position followed by a reduction in the taper rate, i.e., more slowly decreasing diameter as a function of longitudinal position for larger z-dimensions. The longitudinal length of 120 µm in this embodiment can be a function of the process, for example, an etch process, used to fabricate the tapered profile in this first tapered region. In some embodiments, this length is increased to reduce the taper rate. It should be appreciated that the particular geometry utilized for the fiber optic element, for example, the initial diameter of the fiber, the diameter at the distal end (i.e., a greater z-dimension) of the first tapered region, the length of the tapered regions, and the like, as well as the geometry of the motion actuator, for example, the piezoelectric tube length, can impact the resonant frequency achieved using the fiber optic element and can be modified as appropriate to achieve the desired performance criteria. The inventors have determined that the geometry of the first tapered region 410 can be utilized to effect strain relief while the geometry of the second tapered region 412 makes a contribution to the resonant frequency that characterizes the fiber scanner.

The second tapered region 412 has a longitudinal length of 2.53 mm, over which the outer diameter of the fiber optic element decreases from 125 µm to 32 µm. The taper profile is generally linear, decreasing the diameter linearly as a function of longitudinal position, although other taper profiles can be utilized. The longitudinal lengths of the first tapered region and the second tapered region can vary from these particular values, either increasing or decreasing as appropriate to the particular application. Given the lengths and taper rates illustrated in FIG. 4, as well as variations on these parameters, the resonant frequency of the fiber scanner can be in the range of 20-35 kHz, for example, 24 kHz, 27 kHz, 33 kHz, or the like. In other embodiments, lower or higher frequencies are utilized, for example, ranging from 11-60 kHz. One of ordinary skill in the art would recognize many variations, modifications, and alternatives.

The tapering in the light emission region 116 can be rapid, with the tapering decreasing in rate as it approaches the tip. Thus, the slope of the taper can be large in the light delivery region and smaller in the light emission region. As an example, the starting diameter of the fiber can be in the range of 200 µm-250 µm, the rapid tapering can reduce the diameter to a value in the range of 100 µm-125 µm within about 50 µm to 100 µm, for example, 85 µm of fiber length, and then the tapering profile can be reduced to a substantially linear taper to a diameter at the light emission tip 118 of 20 µm-40 µm, for example, 30 µm, 35 µm, or the like. The rapid tapering in the light emission region 116 can provide strain and/or stress relief and, as a result, the tapering profile in this region can be selected to reduce or minimize strain on the fiber during actuation and reduce stress localization. Elliptical profiles, other arcs, including non-linear profiles determined using finite element analysis, and the like can be utilized for the tapering profile. It will be appreciated that the particular dimensions illustrated in FIG. 4 are provided merely by way of example, and other dimensions can be utilized according to embodiments of the present invention without departing from the scope of the present invention. One of ordinary skill in the art would recognize many variations, modifications, and alternatives.

Figure 5A:
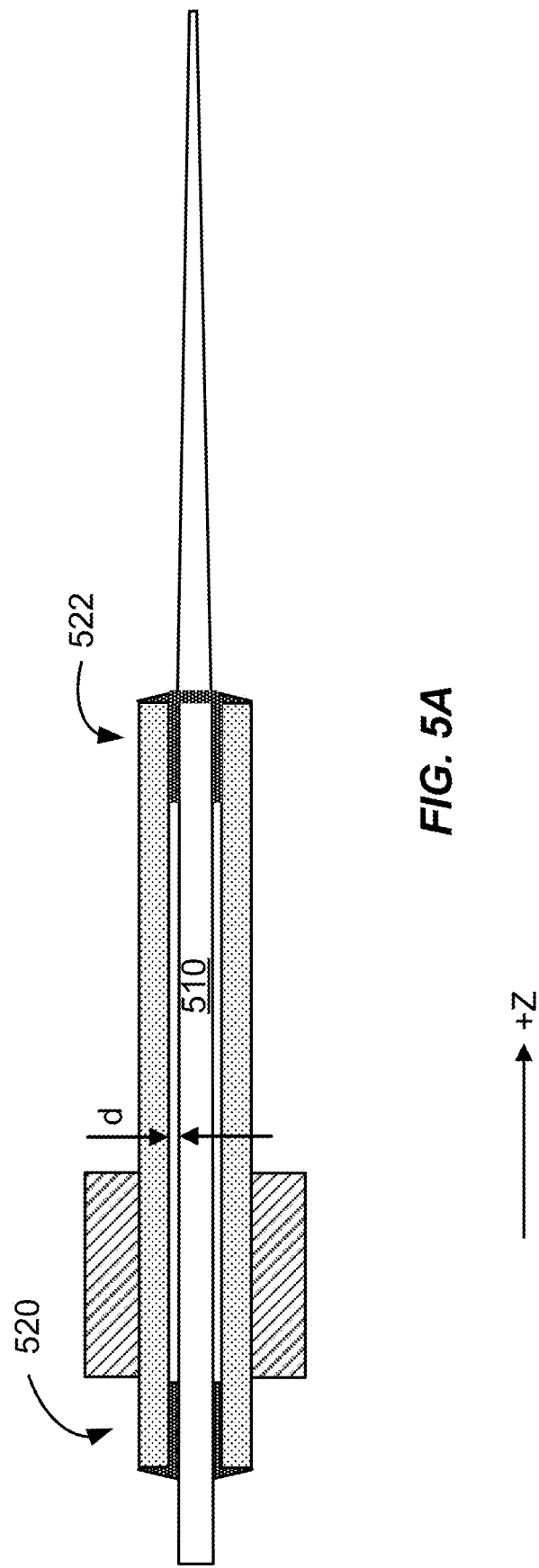
FIG. 5A is a simplified side view illustrating a fiber scanner including a shaped fiber according to an embodiment of the present invention.

FIG. 5A is a simplified side view illustrating a fiber scanner including a shaped fiber according to an embodiment of the present invention. Referring to FIG. 5A, in order to reduce potential binding between the internal surfaces of the motion actuator and the fiber optic element as the fiber oscillates in response to actuation of the motion actuator, a flexure region 510 is provided between the internal surfaces of the motion actuator and the fiber optic element, i.e., the outer surface of the fiber optic element and the inner surface of the motion actuator. The spatial separation, represented by flexure distance d in FIG. 5A, between the periphery of the fiber optic element and the interior sides of motion actuator in the flexure region 510, allows the fiber optic element to move in the lateral direction (i.e., in the x-y plane orthogonal to the longitudinal direction), reducing or eliminating binding as the sides of the motion actuator expand and contract. Additionally, the motion of the fiber optic element in the flexure region should enable the portion of the fiber extending from the motion actuator to experience increased deflection.

Referring to FIG. 5A, it is expected that the flexure region 510 and the resulting physical space separating the periphery of the fiber optic element and the interior sides of the motion actuator will reduce the stiffness of the motion actuator, improve the flexibility, and increase the resonant frequency. Thus, it would be expected that the flexure region 510, which can be formed by reducing the fiber diameter in the flexure region, should enable additional flexibility in comparison with designs that increase the mechanical contact between the fiber optic element and the interior surfaces of the motion actuator.

Accordingly, conventional wisdom would indicate that the fiber scanner illustrated in FIG. 1, in which the bond line between the outer surface of the fiber optic element and the interior sides of the motion actuator is continuous and extends the length of the motion actuator, would potentially result in fracturing of the fiber optic element as the opposing sides of the motion actuator expand/contract with respect to an unactuated size. Additionally, conventional wisdom would indicate that the stiffness of the fiber scanner would be increased by a continuous bond line, thereby increasing the resonant frequency, decreasing the maximum fiber deflection, and the like. Because of differences in the material properties of the materials utilized in the motion actuator (e.g., piezoelectric materials) and the fiber optic element (e.g., glass), it was expected that if the bond line between the outer surface of the fiber optic element and the interior sides of the motion actuator extended the length of the motion actuator, as illustrated in FIG. 1, this continuous bond line would cause binding between the motion actuator and the fiber optic element in addition to the increased stiffness. Moreover, since the motion actuator as a hollow structure expands and contracts locally to implement bending motion as a hollow structure, it was expected that filling of the hollow structure with the solid fiber optic element would reduce the flexibility of the motion actuator and impair performance as a motion actuator.

In fact, the inventors have determined that the mechanical energy imparted by the motion of the motion actuator overcomes the stiffness inherent in the fiber optic element. Additionally, comparing the bond lines in FIGS. 1 and 5A, the separated bond lines in regions 520 and 522 of FIG. 5A provide a structure in which the fiber optic element is only bonded to the interior surfaces of the motion actuator at the ends of the motion actuator. In this structure, the central region of the fiber optic element is free from bonding in the flexure region 510. The inventors have determined that the length of the flexure region, measured along the z-direction of the motion actuator, can result in resonant behavior, which might cause undesirable distortions in the light output or unnecessary wearing out of critical joints, thus resulting in lower product life. Since regions 520 and 522 of the fiber optic element are constrained by the bonding to the bonded portions of the motion actuator in the x-y plane, the vibrational modes of the fiber optic element in the flexure region can support a standing wave as the fiber optic element vibrates harmonically. Given the resonant frequency of the fiber scanner, if the vibrational modes of the fiber optic element in the flexure region, which are a function of the tension and mass of the fiber optic element and the length of the flexure region, result in the anti-nodes of the harmonic vibration being positioned at regions 520 or 522, dampening of the vibration can be produced, thereby reducing the deflection angle of the fiber optic element. In the embodiment illustrated in FIG. 1, since the bond line is continuous, this dampening of the vibration is prevented.

Table 1 illustrates parameters associated with the fiber scanner including a shaped fiber and the continuous bond line fiber scanner provided according to an embodiment of the present invention. As illustrated in Table 1, the scanner illustrated in FIG. 1, given similar geometric conditions, including fiber extension region length, achieves, for a similar computed resonance frequency, a significantly higher deflection (i.e., approximately double the deflection) at driving voltages for the motion actuator of both 80 Vpp and 50 Vpp. The line scan deflection amplitude values are average values measured for several fiber scanners. Moreover, as discussed in relation to FIG. 6, the Q factor for the fiber scanner illustrated in FIG. 1 is higher than the Q factor for the fiber scanner illustrated in FIG. 5A. Accordingly, embodiments of the present invention provide both higher deflection values and higher Q factors than available using fiber scanners with separated bond lines.

TABLE 1

| Parameter | Fiber Scanner-FIG. 5 | Fiber Scanner-FIG. 1 |
| --- | --- | --- |
| Fiber Extension Region Length (mm) | 2.455 | 2.7 |
| Resonance Frequency (kHz) | 24.947 | 24.398 |
| Line Scan Deflection Amplitude at 80 Vpp (Simulation Data) (µm) | 579 | 1172 |
| Line Scan Deflection Amplitude at 50 Vpp (Empirical Data) (µm) | 580 | 1010 |
| Q Factor | 47 | 132 |

The inventors believe, without limiting embodiments of the present invention, that the complete or continuous bond line provided by embodiments of the present invention more effectively transfers the energy generated and/or stored by the motion actuator to the fiber optic element, thereby resulting in the unexpected performance improvements illustrated in Table 1. Moreover, the continuous bond line would be expected to increase the stiffness of the motion actuator, effectively reducing the motion achieved by the motion actuator, contrary to the unexpected performance of the fiber scanners provided by embodiments of the present invention.

Referring back to FIG. 1, the bond line between the inner diameter of the motion actuator and the outer diameter of the fiber optic element, which defines the linear dimension of the bonding between the motion actuator and the fiber optic element, extends the entire length of the motion actuator. In contrast, the bond line for the fiber scanner illustrated in FIG. 5A is only present in small regions 520 and 522 near the proximal and distal ends of the motion actuator. It will be appreciated that the bond line can be extended into a three dimensional shape such as a cylinder by rotation of the bond line around the center of the fiber optic element or the center of the motion actuator. According to embodiments of the present invention, as the motion actuator bends, the provision of the bond line extending along the length of the motion actuator results in distribution of the motion along the entire length of the fiber optic element. As an example, if the motion actuator is flexing such that a first side contracts, the continuous bond line between the motion actuator and the fiber optic element results in the entire surface of the fiber optic element experiencing the contraction, rather than separate sections, some experiencing contraction, and others, where the bond line is not present, experiencing no contraction.

Moreover, the inventors believe, without limiting embodiments of the present invention, that the continuous bond line provided by embodiments of the present invention increases the efficiency with which energy is transferred from the motion actuator to the fiber optic element, thereby increasing the energy transferred to the fiber optic element. The increased energy transfer efficiency can result in increased deflection for a given motion of the motion actuator. Without limiting embodiments of the present invention, the inventors believe that in contrast with systems in which an actuator holds a cantilevered arm that protrudes from the actuator, embodiments of the present invention utilize the continuous bond line to provide a system in which the actuator and the cantilevered arm are in contact over the length of the motion actuator, thereby providing a system with more efficient energy transfer.

Figure 5B:
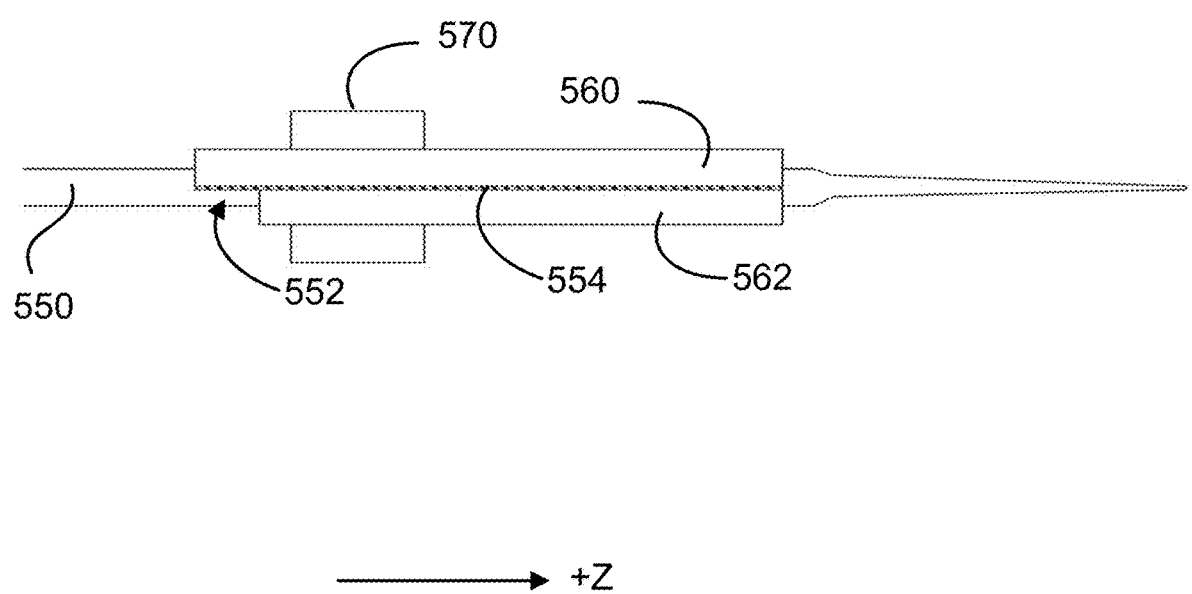
FIG. 5B is a simplified side view illustrating a fiber scanner with variable length actuators according to an embodiment of the present invention.

FIG. 5B is a simplified side view illustrating a fiber scanner with variable length actuators according to an embodiment of the present invention. As illustrated in FIG.

5B, fiber optic element 550 is positioned between a first actuator element 560 having a first longitudinal length and a second actuator element 562 having a second longitudinal length different from the first longitudinal length. The assembled motion actuator is mechanically constrained by retention collar 570, similar to that discussed in relation to FIG. 1. Thus, the individual components of the motion actuator, for example, the actuator elements described in relation to FIGS. 7B-7I below, do not all need to be of equal length.

In the embodiment illustrated in FIG. 5B, the first actuator element 560, which can be a piezoelectric actuator, has a greater length than the second actuator element 562, which can also be a piezoelectric actuator, thereby protruding beyond the second actuator element. As illustrated by the embodiment illustrated in FIG. 5B and described more fully in relation to FIGS. 7B-7I, the inner electrode 554 of the first actuator element is exposed at position 552, thereby facilitating electrical connection to the inner electrode during fabrication (for example, wire-bonding, soldering, connection of press-fit connectors, and the like).

Figure 6:
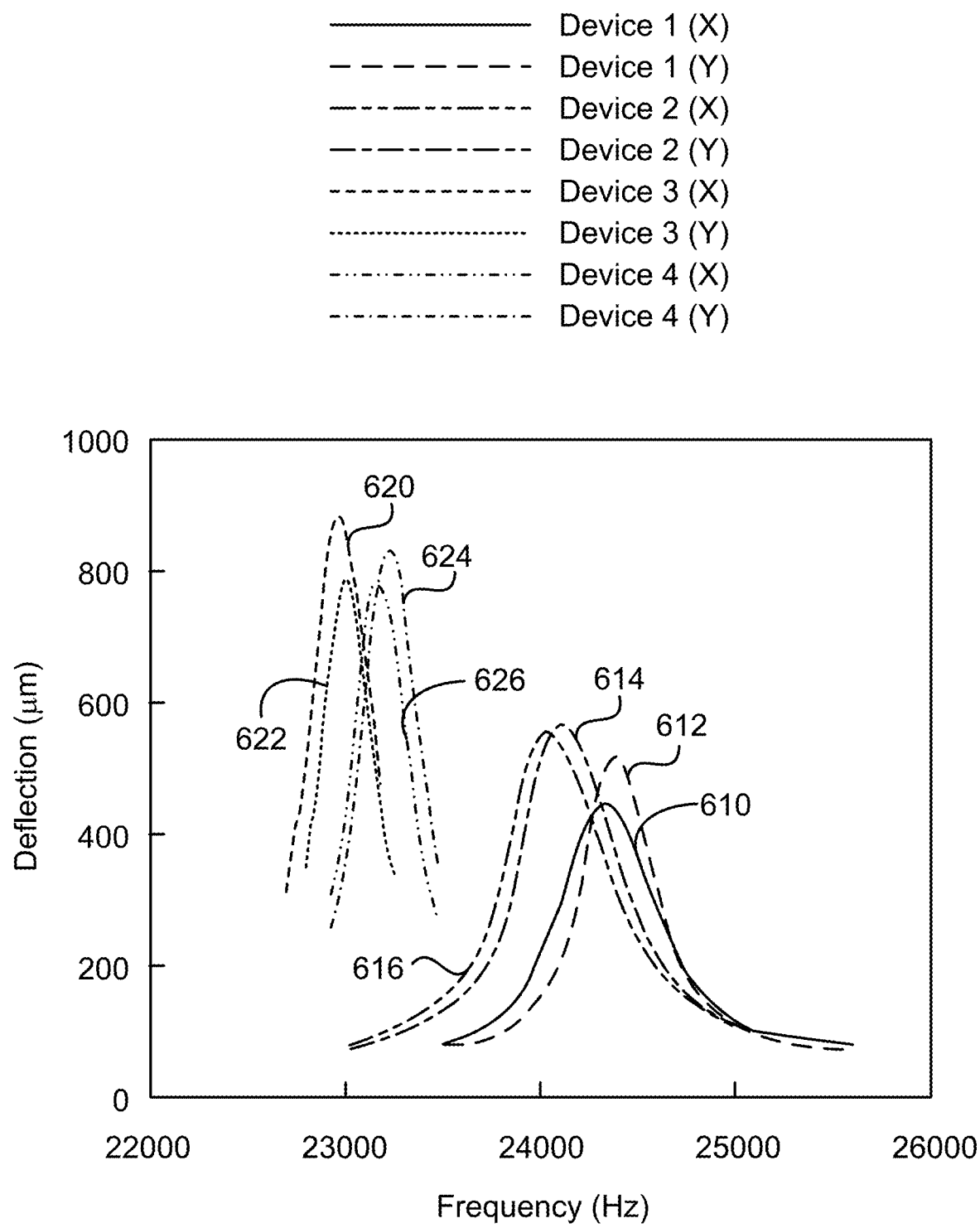
FIG. 6 is a plot of fiber scanner deflection as a function of frequency for different fiber scanners according to an embodiment of the present invention.

FIG. 6 is a plot of fiber scanner deflection as a function of frequency for different fiber scanners according to an embodiment of the present invention. In FIG. 6, the deflection as a function of frequency is illustrated for four different fiber scanners, two utilizing the design illustrated in FIG. 5A (Design 1 and Design 2) and two in accordance with embodiments of the present invention as illustrated in FIG. 1 (Design 3 and Design 4). Referring to FIG. 6, curves 610 and 612 correspond to the deflection as a function of frequency in the x-direction (curve 610) and in the y-direction (curve 612) for a first fiber scanner utilizing the design illustrated in FIG. 5A; curves 614 and 616 correspond to the deflection as a function of frequency in the x-direction (curve 614) and in the y-direction (curve 616) for a second fiber scanner utilizing the design illustrated in FIG. 5A; curves 620 and 622 correspond to the deflection as a function of frequency in the x-direction (curve 620) and in the y-direction (curve 622) for a first fiber scanner in accordance with embodiments of the present invention utilizing the design illustrated in FIG. 1; and curves 624 and 626 correspond to the deflection as a function of frequency in the x-direction (curve 624) and in the y-direction (curve 626) for a second fiber scanner in accordance with embodiments of the present invention utilizing the design illustrated in FIG. 1.

It should be noted that a fiber optic element with an outer diameter of 125 μm was utilized for the fiber scanners associated with curves 610-616, whereas a fiber optic element with an outer diameter of 200 μm was utilized for the fiber scanners associated with curves 620-626. Referring to FIG. 4, the extension region 114 of the fiber is also characterized by a diameter that is tapered, starting at 125 μm. Accordingly, the resonant frequency of the fiber optic element in FIGS. 1 and 4 and the resonant frequency of the fiber optic element illustrated in FIG. 5A should be approximately equal, which is confirmed by the data shown in FIG. 6 that demonstrates that, although the resonant frequencies differ between the alternative designs, they are still within a few percent of each other. In fact, the resonant frequency differences can be due to slightly different fiber optic element shapes as a result of etch processing differences, different epoxy patterns, or the like.

Referring to FIG. 6, the curves for deflection as a function of frequency can be utilized to determine the quality factor, also referred to as a Q factor of each of the fiber scanners. The Q factor, which can be defined as the frequency-to-bandwidth ratio, was determined for curves 610-616, resulting in a Q factor of 60. The Q factor was also determined for curves 620-626, resulting in a Q factor of 90.

The significantly higher Q factor associated with the fiber scanners in accordance with embodiments of the present invention enables the fiber scanner to achieve increased deflection in comparison with the fiber scanner utilizing the design illustrated in FIG. 5A. It should be noted that higher deflection values that are associated with embodiments of the present invention (Design 3 and Design 4) are present in FIG. 6. Moreover, the significantly higher Q factor associated with the fiber scanners provided in accordance with embodiments of the present invention demonstrates that improved energy transfer efficiency from the motion actuator to the fiber optic element is provided by embodiments of the present invention.

Since important physical characteristics of the fiber optic element are defined by the etching process, the inventors have noted improved symmetry in relation to the deflection in the x-direction and y-direction for embodiments of the present invention. The inventors believe, without limiting embodiments of the present invention, that the improvements in symmetry result from reductions in variation of adhesive/epoxy patterns, shapes, and the like. Thus, the increase in controllability of the manufacturing processes provides benefits not available using conventional techniques.

Figure 7A:
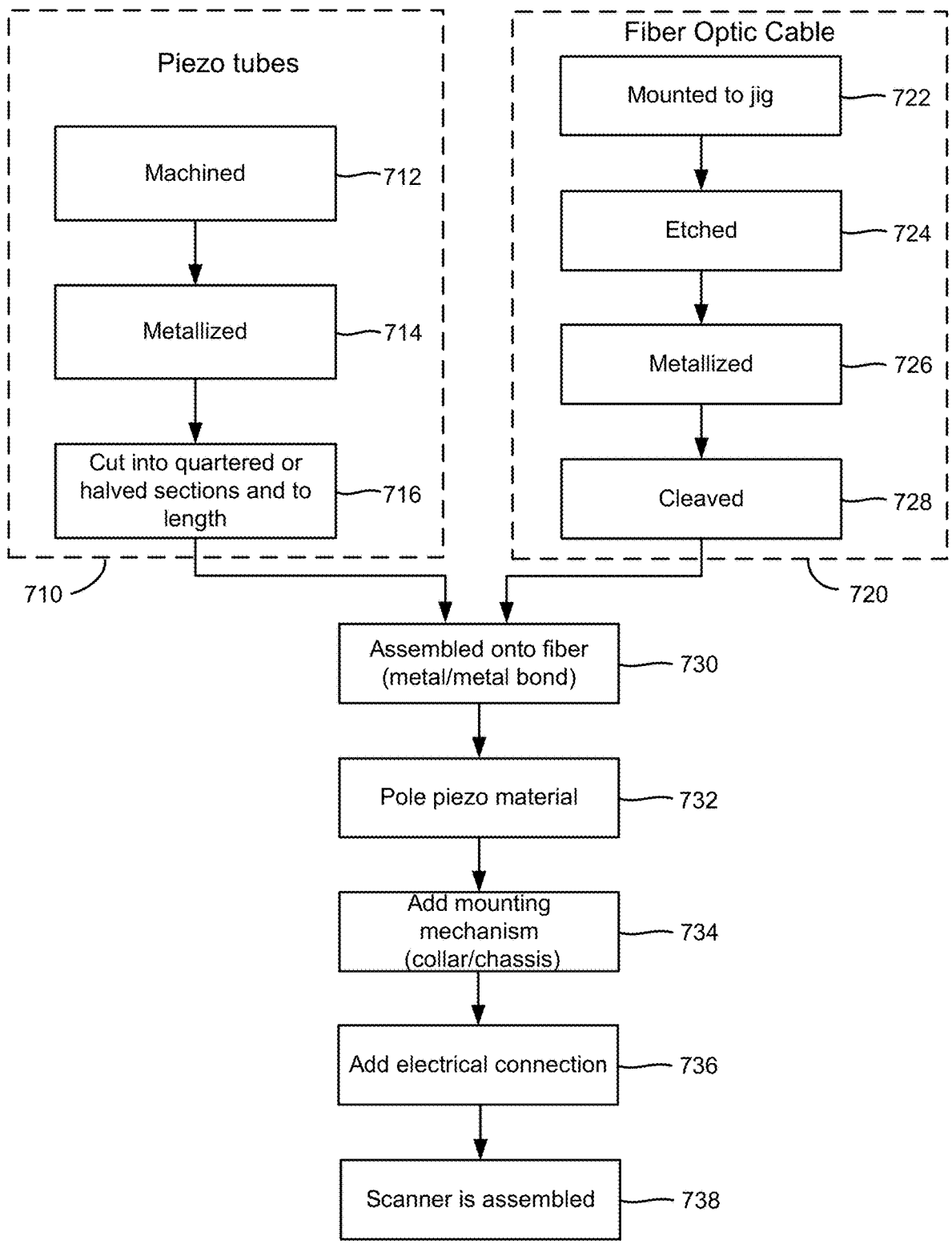
FIG. 7A is a simplified flowchart illustrating a method of fabricating a fiber scanner according to an embodiment of the present invention.

FIG. 7A is a simplified flowchart illustrating a method of fabricating a fiber scanner according to an embodiment of the present invention. FIG. 7B is an exploded perspective view of two piezoelectric tube sections with a hemispherical cross section and a fiber optic element according to an embodiment of the present invention. FIG. 7C is an exploded cross sectional view of two piezoelectric tube sections with a hemispherical cross section and a fiber optic element according to an embodiment of the present invention. FIG. 7D is an exploded cross sectional view of four quartered piezoelectric tube sections and a fiber optic element according to an embodiment of the present invention.

In some embodiments, the piezoelectric elements are referred to as piezoelectric tube elements since they have the general shape of a cylindrical tube; however, embodiments of the present invention are not limited to this particular shape. In other embodiments, for example, for expedience of fabrication, handling, electrode patterning, and the like, piezoelectric elements with one or more flat exterior surfaces of the piezoelectric elements may be utilized. Additional description related to this embodiment is provided in relation to FIGS. 7F, 7G, and 7H below.

In some fabrication processes, the inside of the piezoelectric tube is plated or otherwise coated with a conductive coating to provide one of the electrodes for actuating the piezoelectric material. Typically, it is necessary to seal off one or more portions of the piezoelectric tube to prevent plating in unwanted areas.

As illustrated in FIG. 7A, the method of fabricating a fiber scanner includes processes 710 and 720, which are applicable to piezoelectric tubes and the fiber optic element, respectively. In the description for this figure, a piezoelectric tube is illustrated as an example of a motion actuator, but the motion actuator is not limited to piezoelectric tubes and other motion actuators are included within the scope of the present invention. Accordingly, the description related to piezoelectric tubes in FIG. 7A is applicable to a broader range of motion actuators as appropriate.

Referring to FIG. 7A, process 710 includes machining of one or more piezoelectric tube sections (712) and metallization of the one or more piezoelectric tube sections (714). Referring to FIG. 7B, a first piezoelectric tube section 750 and a second piezoelectric tube section 752 are illustrated partially surrounding fiber optic element 746. The metallization process can apply a metal coating to form one or more electrodes, for example, both electrodes of the piezoelectric actuator. For instance, the interior portion of a tube section that has a hemispherical cross section can be metallized to form a first electrode and the exterior portion of the tube section with a hemispherical cross section can be metallized to form a second electrode. These tube sections can be referred to as hemispherical tube sections in reference to the cross section of the piezoelectric tube, which is generally cylindrical. It should be noted that, in some embodiments, the piezoelectric tube section is cylindrical on the inside, but has a rectangular cross section on the outside, which may result in increased ease of fabrication. In some embodiments in which the fiber optic element is coated with a metallic or other electrically conducting coating, the metallization of the interior portion of the piezoelectric tube section can be eliminated.

In an alternative embodiment, rather than using piezoelectric tube sections, a cylindrical piezoelectric tube is utilized. Sputtering and/or evaporation processes may not be able to fully coat the inside of the piezoelectric tube with a desired uniformity. However, embodiments of the present invention can metallize the inside of the piezoelectric tube, for example, by flowing a conductive liquid, for example, by capillary action, into the inside of the piezoelectric tube, which would then evaporate to form the desired metallic coating on the inside of the piezoelectric tube. In another embodiment, a plating process can be utilized to coat the inside of the piezoelectric tube.

The shape of fiber optic element 746 can include a tapered oscillation region as illustrated in FIG. 4. The piezoelectric tubes are cut into quartered or halved sections and to length (716). As illustrated in FIGS. 7B and 7C, hemispherical shapes are formed by the machining process although quartered shaped as illustrated in FIG. 7D can also be utilized. In addition to machining, other fabrication processes, including extrusion to extrude the piezoelectric tube sections as well as injection molding, are included within the scope of the present invention. In some embodiments, one or more of the cutting processes applied to the piezoelectric tubes at 716 is performed prior to metallization at 714. Thus, the individual steps illustrated in FIG. 7A may be performed in various sequences as appropriate to the individual step.

Referring to FIGS. 7B and 7C, two hemispherical piezoelectric tube sections 750 and 752 are positioned adjacent fiber optic element 746. An exploded view is utilized in FIG. 7B for purposes of clarity. Electrodes 751, 753, 755, and 757 are formed on the exterior surfaces of the piezoelectric tube sections 750 and 752. As discussed in relation to FIG. 1, a bias voltage can be applied to electrodes 751, 753, 755, and 757 while the metallic coating on the fiber optic element is grounded or placed at a bias voltage. Referring to FIG. 7D, four quartered piezoelectric tube sections 760, 762, 764, and 766 are positioned adjacent fiber optic element 746. Similar to the embodiment illustrated in FIG. 7C, four electrodes can be formed on the exterior surfaces of the piezoelectric tube sections 760, 762, 764, and 766, respectively. As discussed in relation to FIG. 1, a bias voltage can be applied to these electrodes while the metallic coating on the fiber optic element is grounded or placed at a bias voltage. It should be appreciated that the embodiments illustrated in FIGS. 7C and 7D utilize four electrodes to achieve motion in up to three dimensions, but this is not required by the present invention. In addition to four quadrants, it is possible to utilize three electrodes, for example, oriented at 120° with respect to each other, two electrodes, for example, oriented at 1800 with respect to each other, or the like. Thus, motion in one dimension, two dimensions, or three dimensions is enabled by embodiments of the present invention. Moreover, more than four electrodes can be utilized in some embodiments.

In order to prepare the fiber optic element (720) for assembly with the piezoelectric tube sections, the method includes mounting the fiber optic element to a jig (722) for ease of handling during processing. A fiber optic element can be cut into sections to provide fiber optic elements for use in the embodiments described herein, specifically prior to mounting. The initial sectioning can provide a fiber optic element with an initial length longer than a final length, enabling the fiber optic element to be cleaved to a final length as described more fully below. The initial length enables handling operations and can be performed with relatively low tolerances.

In some implementations, mounting of the fiber optic element can include cleaning of the fiber, including removal of plastic or other buffer coatings on exterior surfaces of the fiber optic element, for example, using an etch including a mixture of sulfuric acid ($H_2SO_4$) and hydrogen peroxide ($H_2O_2$), which can be referred to as a piranha etch. Other buffer coating removal processes can be utilized, including thermal processes or the like.

Once the fiber optic element is mounted, the fiber optic element is etched to form the desired shape (724), for example, the shape illustrated in FIG. 4. The etch process can be multistep as described more fully in U.S. patent application Ser. No. 15/851,005, filed on Dec. 21, 2017, the disclosure of which is hereby incorporated by reference in its entirety for all purposes. The fiber optic element is metallized (726) to form an electrically conductive coating on the exterior surface of the fiber optic element. The metallization can include a multilayer stack of metals, such as a chrome layer to provide adhesion and a gold layer on the chrome layer to provide high conductivity and high quality bonding to the metallization on the interior surface of the piezoelectric tube sections. Other metals can be utilized in addition to chrome and gold, including nickel, silver, platinum, titanium, combinations thereof, and the like. Since the fiber optic element is metallized in some embodiments, the need to metallize both surfaces of the motion actuator can be eliminated since the voltage used to actuate the motion actuator can be applied between one surface of the motion actuator and the surface of the fiber optic element. The fiber optic element can be metallized uniformly or in a patterned manner to provide electrical isolation between portions of the outer surface, for example, in a quartered pattern similar to the quartered pattern illustrated with respect to the piezoelectric tube elements in FIG. 7D.

Referring to FIG. 7B, the portions of the fiber optic element 746 disposed between the piezoelectric tube sections 750 and 752 are metallized, although other portions of the fiber optic element can be metallized. As an example, when the fiber is utilized in a capacitive sensing application, metallization of the light emission region 116 of the fiber optic element can enable the position of the tip of the fiber optic element to be determined.

As an example, one or more additional portions of the fiber optic element can be coated, for example, along the cantilever region including either the extension region and/or the light delivery tip, to enable position sensing and/or motion sensing of the scanning cantilever. In some embodiments, metallization along the cantilever is patterned such that the cantilever metallization is discrete, for example, electrically isolated, from the metallization of the interior portion (i.e., the inner electrode) of the piezoelectric element.

Thus, in some embodiments, the entire length of the fiber optic element or portions of the length of the fiber optic element can be metallized in some embodiments. The use of a mask to protect regions of the fiber optic element from metal may not be needed since subsequent cleaving processes to produce the final length can cleave off metallized surfaces that would otherwise block or attenuate light transmission. Embodiments of the present invention may utilize a mask to prevent metallization as appropriate. As discussed above in relation to the fabrication of the piezoelectric tube sections, the individual steps illustrated in process 720 may be performed in various sequences as appropriate to the individual step, for example, cleaving (728) prior to metallization (726). One of ordinary skill in the art would recognize many variations, modifications, and alternatives.

Referring to process 720, the fiber optic element is cleaved (728) to achieve the final length of the fiber optic element. In some embodiments, cleaving after metallization enables the tip to be protected during processing, only exposing the tip of the fiber optic element as a final step of process 720. Similar arguments are applicable to the injection end of the fiber optic element.

The method also includes assembling the piezoelectric actuator by assembling the previously prepared piezoelectric tube sections to the fiber optic element (730), which, for cases in which the peripheral surface of the fiber optic element is metallized, can include a metal/metal bonding process. In some implementations, pressure is applied to the piezoelectric tube sections as they are placed around the fiber optic element, thereby enabling metal-to-metal bonding processes that utilize pressure during the bonding process, which can be a press-fit process. Depending on the particular metal-to-metal bonding process, micro bumps can be formed on one of the surfaces to be bonded while a constant thickness layer is formed on the other surface to be bonded. Upon the application of pressure, the micro bumps deform to provide a high quality metal-to-metal bond characterized by high adhesion and high conductivity. Conductive adhesives and adhesion promoters can also be utilized as components of the metal-to-metal bond process. The piezoelectric material is poled (732) by applying a voltage across the piezoelectric material. In an example, the metallized surface of the fiber optic element is grounded (i.e., neutral) and the metallization forming the electrodes on the exterior surfaces of the piezoelectric tube sections is held at the bias voltage suitable for poling of the piezoelectric material. Referring to FIG. 7C, each of the electrodes 751, 753, 755, and 757 can be held at the same bias voltage to produce the same voltage drop across the piezoelectric tube sections 750 and 752. In other embodiments in which the piezoelectric tube sections are metallized on both sides, the bias voltage is applied across the piezoelectric material by contacting the electrode on the exterior surface of the piezoelectric tube section and the opposing electrode on the interior surface of the piezoelectric tube section. One of ordinary skill in the art would recognize many variations, modifications, and alternatives.

It will be appreciated that the use of the continuous bond line structure enables manufacturing processes, including poling of the piezoelectric materials after assembly, that are not available using conventional techniques. For instance, post-processing of materials is enabled by provision of the metal contact on the inside surface of the motion actuator, for example, the poling illustrated at process 732. One of ordinary skill in the art would recognize many variations, modifications, and alternatives.

Referring once again to FIG. 7A, a mounting mechanism is mounted (734), for example, the retention collar 140 illustrated in FIG. 1, to provide mechanical support for the fiber scanner. Electrical connections are added (736) and additional steps are performed as needed to assemble the fiber scanner (738).

In an alternative fabrication process, a length of fiber optic cable is stretched out and multiple piezoelectric tube elements, for example, the hemispherical tube elements illustrated in FIG. 7B, can be clamped around the fiber at predetermined distances. Subsequently, the fiber optic cable can be cut to form individual fiber optic elements with the piezoelectric tube elements already attached. In this alternative fabrication process, the fiber optic cable can be metallized along the entire length or in predetermined sections before assembly with the piezoelectric tube elements.

In another alternative fabrication process, after metallization of the fiber optic element at process 726, a piezoelectric material is applied to the metallized fiber optic element. Thus, piezoelectric materials, in a non-sintered, flexible state, can be applied to the metallized fiber optic element. Additionally, piezoelectric materials can be deposited onto the metallized fiber, for example, using a sputter deposition, to form a continuous bond line structure in the form of a coating applied to the fiber optic element. As one example, piezoelectric materials in liquid form can be applied and annealed to form the piezoelectric material coating. In another example, the piezoelectric materials can be molded around the metallized fiber optic element. In yet another example, the piezoelectric materials can be extruded directly onto the metallized fiber optic element. In some embodiments, the piezoelectric materials can be applied and/or deposited in a patterned manner such that electrical isolation between adjacent piezoelectric elements can be implemented during manufacturing.

If the sintering temperatures of the piezoelectric material are incompatible with processing temperatures appropriate for the fiber optic element, a precision ferrule with a predetermined (e.g., precise) inner diameter (e.g., matched to the outer diameter of the fiber optic element) can be utilized to provide a structure on which the piezoelectric tube elements can be fabricated.

Figure 7E:
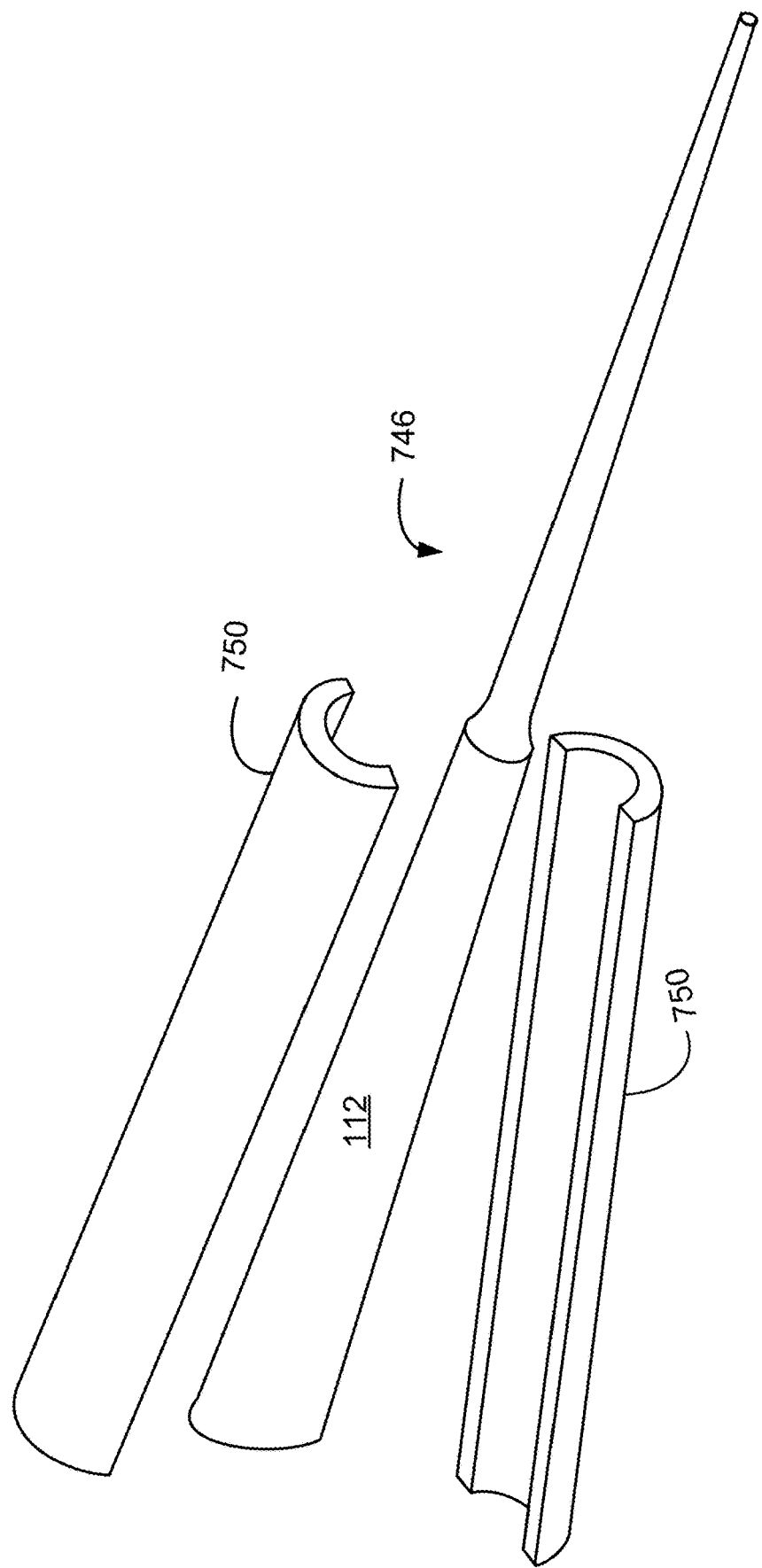
FIG. 7E is a simplified schematic diagram illustrating assembly of a fiber optic element and motion actuator according to an embodiment of the present invention.

FIG. 7E is a simplified schematic diagram illustrating assembly of a fiber optic element and motion actuator according to an embodiment of the present invention. As illustrated in FIG. 7E, the fiber optic element is tapered (e.g., using a very slight taper, for example, several microns over a distance of several millimeters) in the actuation region 112. Accordingly, FIG. 7E is not drawn to scale. The piezoelectric elements, illustrated as a set of opposing hemispherical piezoelectric tube sections, are tapered using a matching taper profile. Accordingly, as the fiber optic element and the piezoelectric elements are assembled into a unit, the tapered profiles are forced together resulting in a press fit structure. For metal-to-metal bonding implementations, the pressure created by the joining of the tapered profiles will enhance the strength and quality of the resulting metal-to-metal bonds. Although a set of opposing hemispherical piezoelectric tube sections are illustrated in FIG. 7E, a cylindrical piezoelectric tube with a slightly tapered profile can also be utilized in conjunction with the illustrated method. Moreover, improvements in alignment between elements is provided by the embodiment illustrated in FIG. 7E. One of ordinary skill in the art would recognize many variations, modifications, and alternatives.

Figure 7F:
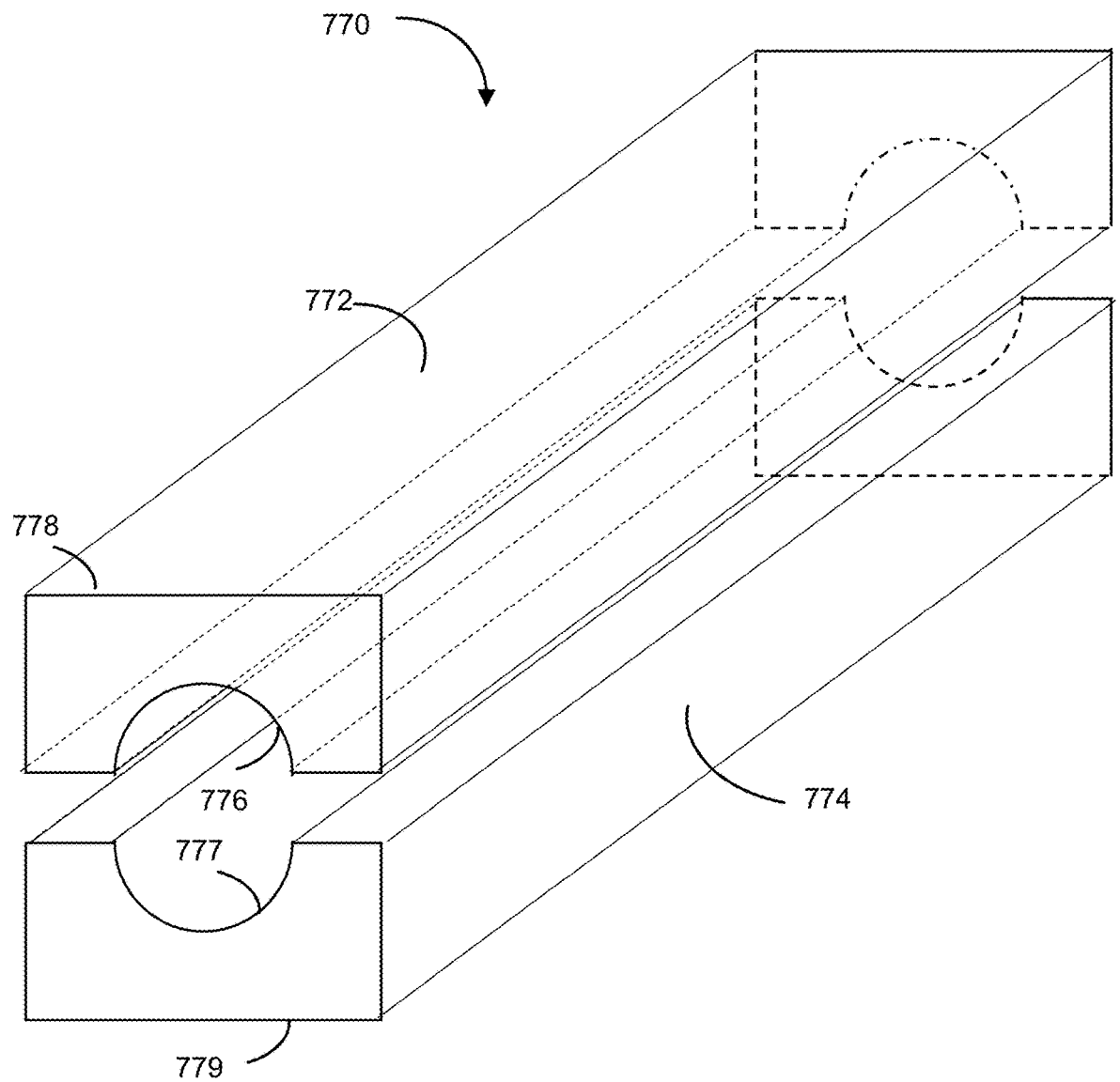
FIG. 7F is an exploded perspective view of two piezoelectric sections with a semicircular interior cross section and rectangular exterior cross section according to an embodiment of the present invention.

FIG. 7F is an exploded perspective view of two piezoelectric sections with a semicircular interior cross section and rectangular exterior cross section according to an embodiment of the present invention. As illustrated in FIG. 7F, the interior and exterior shapes of the piezoelectric elements 772 and 774, also referred to as piezoelectric sections, can vary from each other. Thus, although some piezoelectric elements are fabricated as a "tube" with a cylindrical shape and circular cross sections when assembled, embodiments of the present invention are not limited to this particular shape. As illustrated in FIG. 7F, one implementation can include a cylindrical shape 776 on the interior of piezoelectric element 772 of the assembled piezoelectric actuator 770, but a rectangular shape 778 on the exterior of piezoelectric element 772 of the piezoelectric actuator 770. Similarly, a cylindrical shape 777 is implemented on the interior of piezoelectric element 774 of the assembled piezoelectric actuator 770, but a rectangular shape 779 is implemented on the exterior of piezoelectric element 774 of the piezoelectric actuator 770. The rectangular exterior can be utilized in order to increase the ease of fabrication or for other reasons. Thus, the examples of piezoelectric tubes described herein are not intended to limit the scope of the present invention, but only to provide examples of shapes that can be used. Thus, in general, some embodiments of the present invention utilize piezoelectric elements, which may be piezoelectric tubes, but may also include combination shape elements as illustrated in FIG. 7F with one or more flat exterior surfaces for a variety of reasons including expedience of fabrication, handling, electrode patterning, and the like.

Figure 7G:
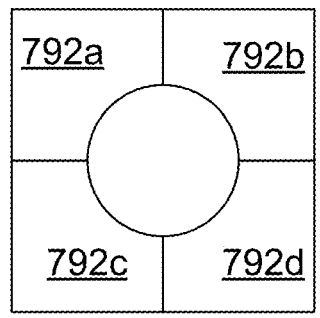
FIG. 7G illustrates cross-sectional diagrams of quartered piezoelectric elements at various stages of electrode formation according to an embodiment of the present invention.
Figure 7G:
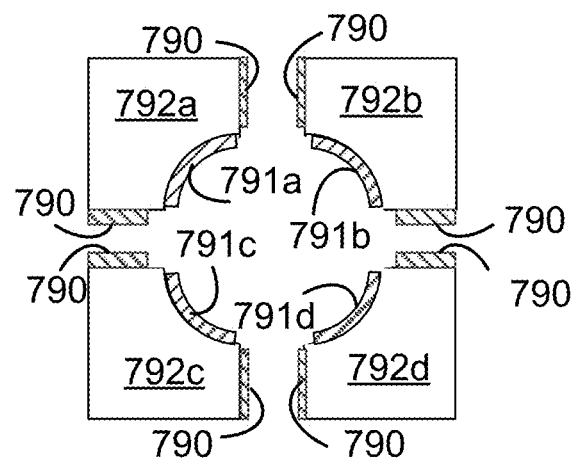
Figure 7G:
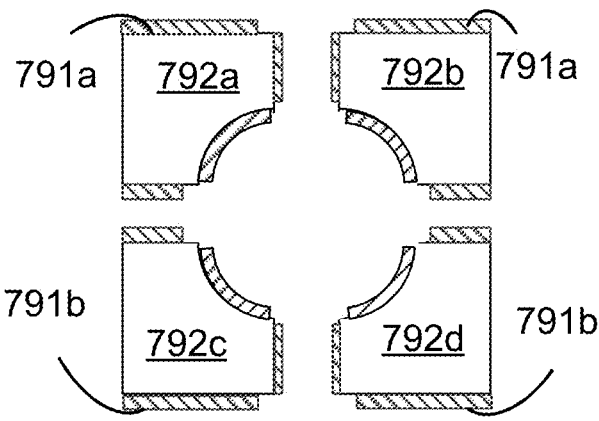
Figure 7G:
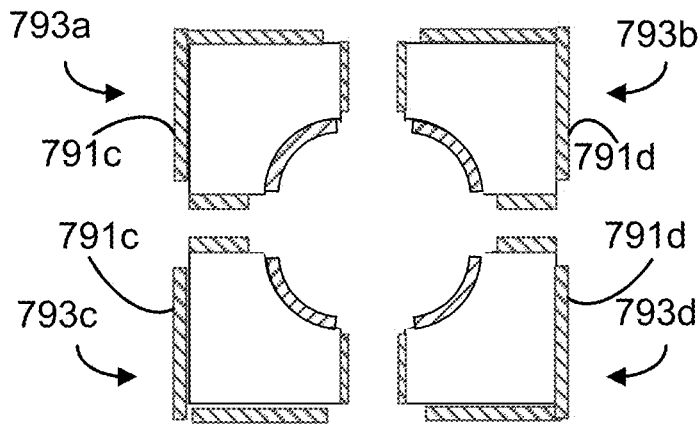

FIG. 7G illustrates cross sectional diagrams of quartered piezoelectric elements at various stages of electrode formation according to an embodiment of the present invention. As illustrated in FIG. 7G, 781, 782, 783, and 784 illustrate quartered piezoelectric elements in an assembled state (781) and in various stages of electrode formation (782, 783, and 784). In this example, at the stage of electrode formation 782, the interior surfaces of the quartered piezoelectric elements 792a, 792b, 792c, and 792d are coated to form inner electrodes 791a, 791b, 791c, and 791d that are electrically isolated. Bonding materials 790, which may include metals, adhesives, or the like, are deposited or otherwise formed on the mating surfaces of the quartered piezoelectric elements 792a, 792b, 792c, and 792d in the stage of electrode formation 782.

As illustrated in the stage of electrode formation 783, top and bottom electrodes 791a and 791b, respectively are formed on the quartered piezoelectric elements 792a/792b and 792c/792d, followed by left and right side electrodes 791c and 791d that are formed in the stage of electrode formation 784. As illustrated in the assembled state 781 in FIG. 7G, the top/bottom and right/left electrodes are electrically connected at the corners of the quartered piezoelectric elements 792a, 792b, 792c, and 792d, thereby providing four exterior electrodes 793a, 793b, 793c, and 793d that oppose the corresponding inner electrode of the four inner electrodes 791a, 791b, 791c, and 791d. Accordingly, the actuation field can be applied across the quartered piezoelectric elements 792a, 792b, 792c, and 792d.

Figure 7H:
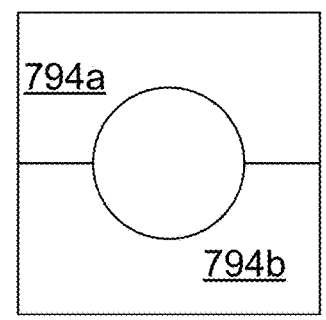
FIG. 7H illustrates cross-sectional diagrams of halved piezoelectric elements at various stages of electrode formation according to an embodiment of the present invention.
Figure 7H:
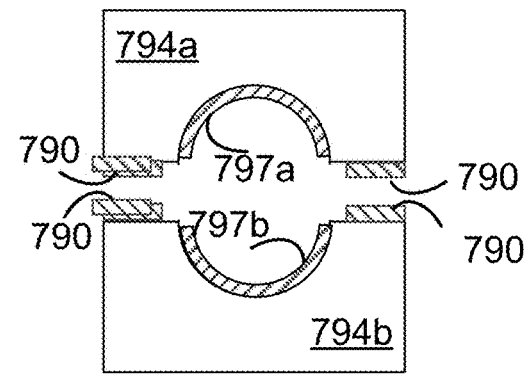
Figure 7H:
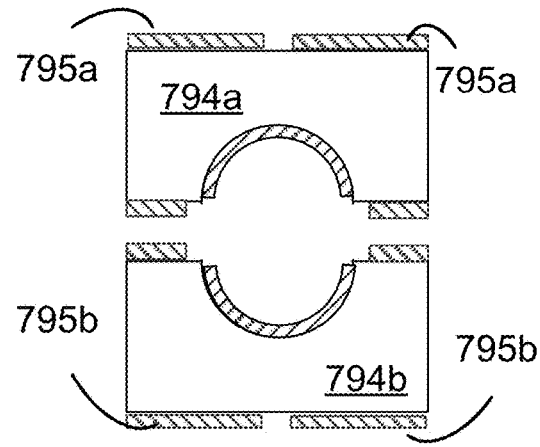
Figure 7H:
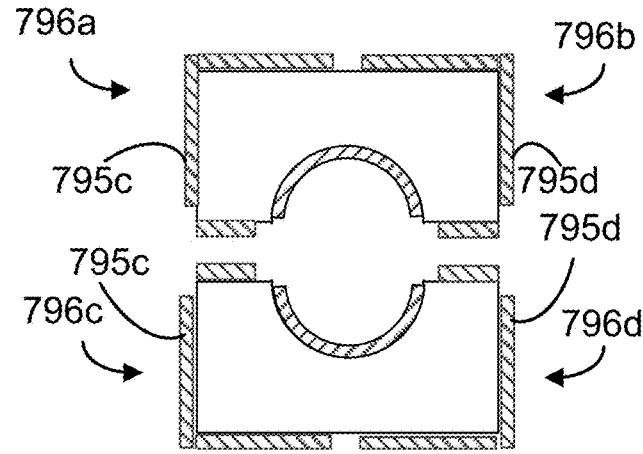

FIG. 7H illustrates cross sectional diagrams of halved piezoelectric elements at various stages of electrode formation according to an embodiment of the present invention. Referring to FIG. 7H, 785, 786, 787, and 788 illustrate halved piezoelectric elements 794a and 794b in an assembled state (785) and in various stages of electrode formation (786, 787, and 788). In this example, the interior surfaces of the halved piezoelectric elements 794a and 794b are coated to form inner electrodes 797a and 797b that are electrically isolated. Bonding materials 790, which may include metals, adhesives, or the like, are deposited or otherwise formed on the mating surfaces of the halved piezoelectric elements 794a and 794b in the stage of electrode formation 786.

Top electrodes 795a and bottom electrodes 795b are formed on the halved piezoelectric elements 794a and 794b in the stage of electrode formation 787, followed by left side electrodes 795c and right side electrodes 795d that are formed in the stage of electrode formation 788 to thereby form four exterior electrodes 796a, 796b, 796c, and 796d. As illustrated in FIG. 7H, the top/bottom and right/left electrodes are electrically connected at the top and bottom corners of the halved piezoelectric elements 794a and 794b, thereby providing four exterior electrodes 796a, 796b, 796c, and 796d, with two of the exterior electrodes (796a and 796b) opposing the top inner electrode 797a and two of the exterior electrodes (796c and 796d) opposing the bottom inner electrode 797b. Accordingly, the actuation field can be applied across half of each of the halved piezoelectric elements 794a and 794b.

The formation of the electrodes can utilize various methods of patterning conductive materials. One form of patterning is to print/lithograph/deposit discrete electrodes on the outer surface of the piezoelectric actuator elements as illustrated in FIGS. 7G and 7H. Another form of patterning is to separate the inner electrode in the hemi-cylindrical region from one or more metallization regions that are used, for example, primarily, to bond the four quarters (or two halves) of the piezoelectric actuator together. As an alternative to patterning by printing techniques, the electrodes and/or bonding materials can be patterned by metallizing (e.g., uniformly) one or more portions of the piezoelectric element and then removing the metal in predetermined areas via ablation/milling/etching or the like.

Figure 7I:
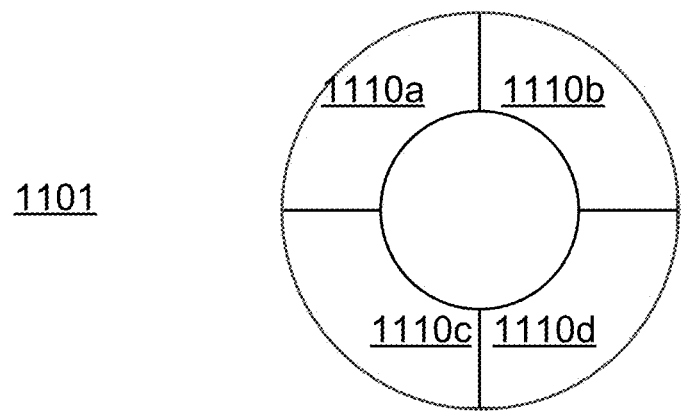
FIG. 7I illustrates cross-sectional diagrams of quartered piezoelectric elements at various stages of electrode formation and bonding according to an embodiment of the present invention.
Figure 7I:
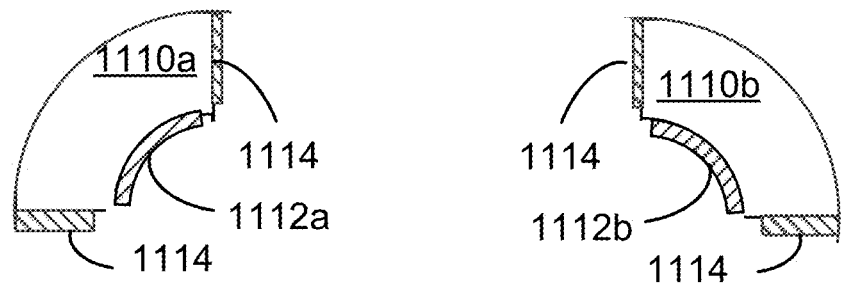
Figure 7I:
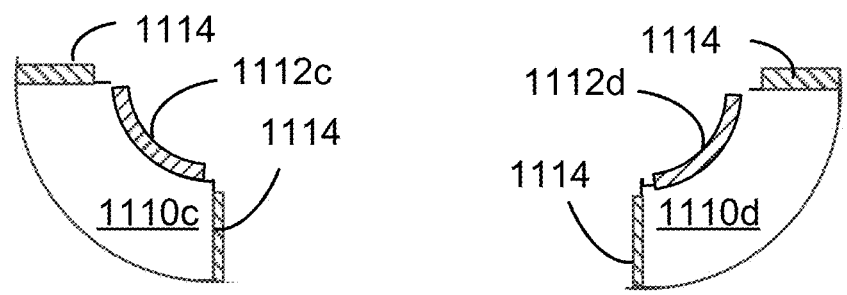

FIG. 7I illustrates cross sectional diagrams of quartered piezoelectric elements at various stages of electrode formation and bonding according to an embodiment of the present invention. The assembled state 1101 and a stage of electrode formation 1102 are illustrated. As illustrated in FIG. 7I, inner electrodes 1112a, 1112b, 1112c, and 1112d can be formed on the interior surfaces, for example, using the techniques discussed above. In order to facilitate bonding of the quartered piezoelectric elements 1110a, 1110b, 1110c, and 1110d, which have cylindrical inner and outer surfaces in this embodiment, the flat edges of the quartered piezoelectric elements can be coated partially or fully with a suitable bonding material 1114, including adhesives such as epoxy, glass frit, metallic materials, or the like. The formation order can vary depending on the materials utilized, with the bonding material 1114 formed first and the electrodes 1112a, 1112b, 1112c, and 1112d formed second or with the electrodes formed first and the bonding material formed second. One of ordinary skill in the art would recognize many variations, modifications, and alternatives.

Figure 7J:
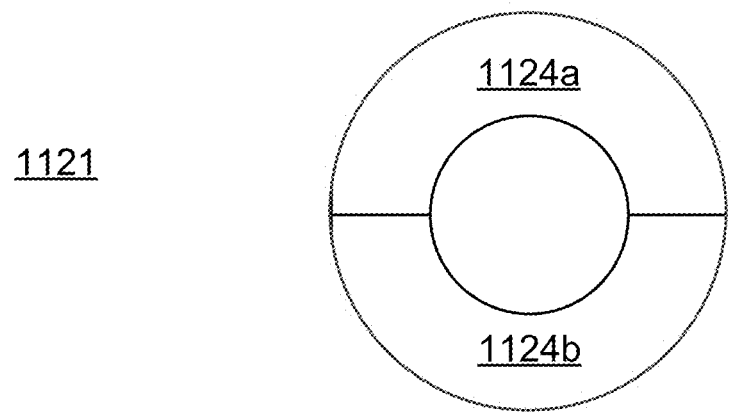
FIG. 7J illustrates cross-sectional diagrams of halved piezoelectric elements at various stages of electrode formation and bonding according to an embodiment of the present invention.
Figure 7J:
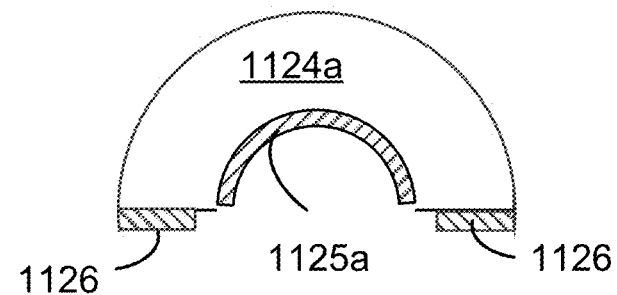
Figure 7J:
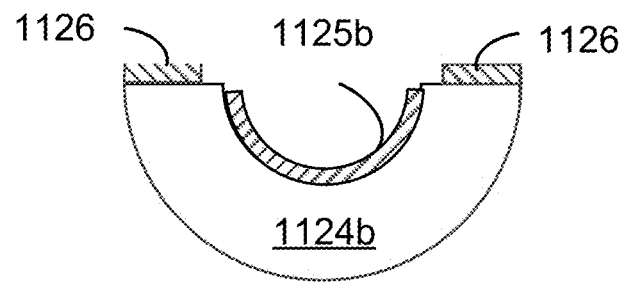

FIG. 7J illustrates cross sectional diagrams of halved piezoelectric elements at various stages of electrode formation and bonding according to an embodiment of the present invention. The assembled state 1121 and a stage of electrode formation 1122 are illustrated. As illustrated in FIG. 7J, inner electrodes 1125a and 1125b can be formed on the interior surfaces of halved piezoelectric elements 1124a and 1124b, for example, using the techniques discussed above. In order to facilitate bonding of the halved piezoelectric elements 1124a and 1124b, which have cylindrical inner and outer surfaces in this embodiment, the flat edges of the halved piezoelectric elements 1124a and 1124b can be coated partially or fully with a suitable bonding material 1126, including adhesives such as epoxy, glass frit, metallic materials, or the like. The formation order can vary depending on the materials utilized, with the bonding material 1126 formed first and the electrodes 1125a and 1125b formed second or with the electrodes formed first and the bonding material formed second. One of ordinary skill in the art would recognize many variations, modifications, and alternatives.

It should be appreciated that the specific steps illustrated in FIG. 7A provide a particular method of fabricating a fiber scanner according to another embodiment of the present invention. Other sequences of steps may also be performed according to alternative embodiments. For example, alternative embodiments of the present invention may perform the steps outlined above in a different order. Moreover, the individual steps illustrated in FIG. 7A may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
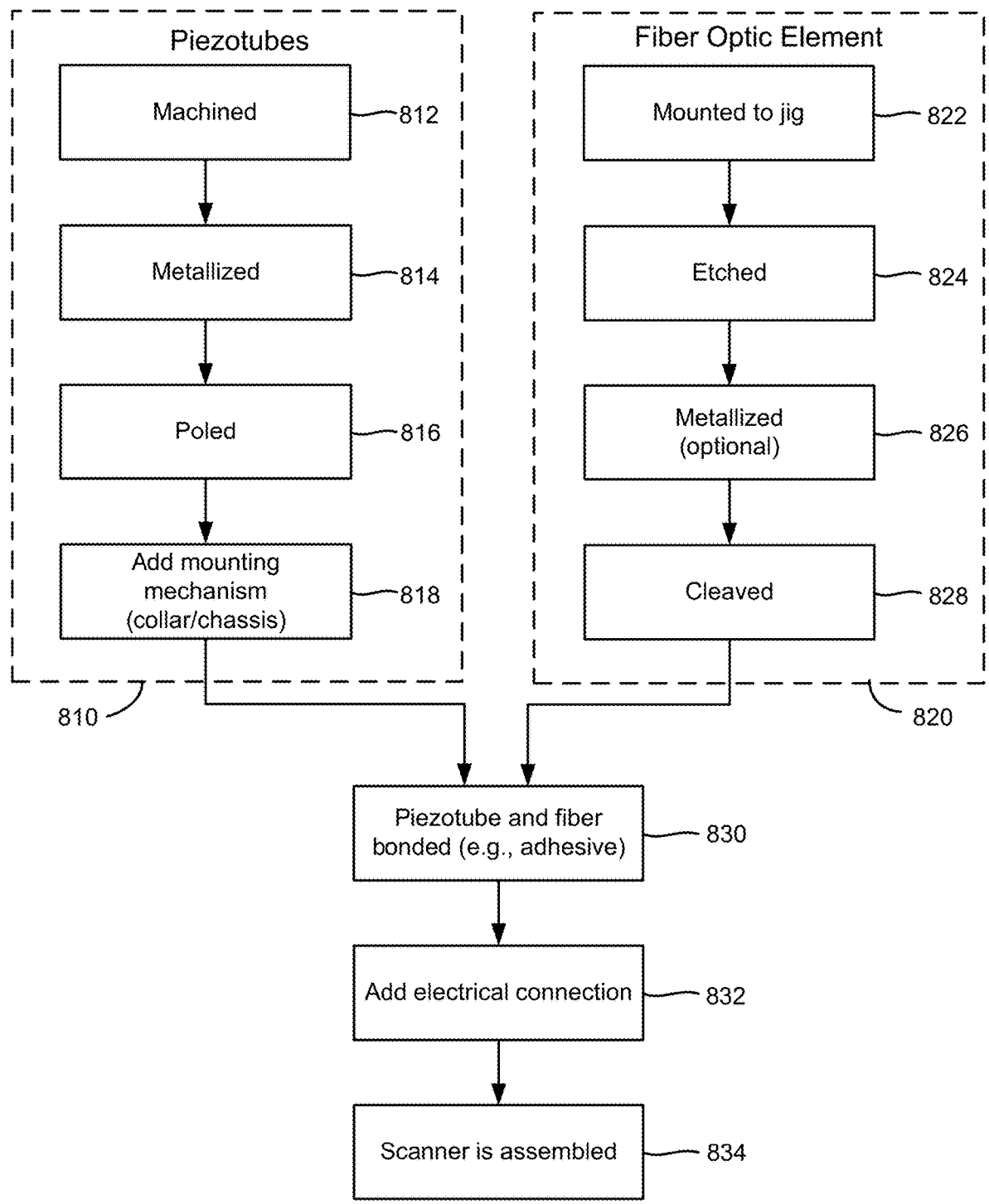
FIG. 8 is a simplified flowchart illustrating a method of fabricating a fiber scanner using unsectioned piezoelectric tubes according to an embodiment of the present invention.

FIG. 8 is a simplified flowchart illustrating a method of fabricating a fiber scanner using unsectioned piezoelectric tubes according to an embodiment of the present invention. The method illustrated in FIG. 8 shares some common features with the method illustrated in FIG. 7A and the discussion provided in relation to FIG. 7A is applicable to FIG. 8 as appropriate.

As illustrated in FIG. 8, the method of fabricating a fiber scanner includes processes 810 and 820, which are applicable to piezoelectric tubes and the fiber optic element, respectively. In the description for this figure, a piezoelectric tube is illustrated as an example of a motion actuator, but the motion actuator is not limited to piezoelectric tubes and other motion actuators are included within the scope of the present invention. Accordingly, the description related to piezoelectric tubes in FIG. 8 is applicable to a broader range of motion actuators as appropriate.

Referring to FIG. 8, process 810 includes machining of one or more piezoelectric tube sections (812) and metallization of the one or more piezoelectric tube sections (814). The metallization process can apply a metal coating as one or more electrodes, for example, both electrodes of the piezoelectric actuator. In this embodiment, the interior portion of a hemispherical tube section is metallized to form a first electrode and the exterior portion of the hemispherical tube section is metallized to form a second electrode.

The piezoelectric material is poled (816) by applying a voltage across the piezoelectric material using the electrodes previously formed during the metallization process. In an example, the metallized surface of the fiber optic element is grounded (i.e., neutral) and the metallization forming the electrodes on the exterior surfaces of the piezoelectric tube sections is held at the bias voltage suitable for poling of the piezoelectric material. Referring to FIG. 7C, each of the electrodes 751, 753, 755, and 757 can be held at the same bias voltage to produce the same voltage drop across the piezoelectric tube sections 750 and 752. Thus, the bias voltage is applied across the piezoelectric material by contacting the electrode on the exterior surface of the piezoelectric tube section and the opposing electrode on the interior surface of the piezoelectric tube section. One of ordinary skill in the art would recognize many variations, modifications, and alternatives.

In an embodiment, the piezoelectric tubes are cut into quartered or halved sections and to length after they are metallized and before they are poled. As illustrated in FIGS. 7B and 7C, hemispherical shapes are formed by the machining process although quartered shaped as illustrated in FIG. 7D can also be utilized. In addition to machining, other fabrication processes, including extrusion to extrude the piezoelectric tube sections as well as injection molding are included within the scope of the present invention. In the embodiment illustrated in FIG. 8, one or more of the cutting processes applied to the piezoelectric tubes are performed prior to metallization (814). In other embodiments, the individual steps illustrated in FIG. 8 may be performed in various sequences as appropriate to the individual step.

Referring once again to FIG. 8, a mounting mechanism is mounted (818), for example, the retention collar 140 illustrated in FIG. 1, to provide mechanical support for the fiber scanner.

In order to prepare the fiber optic element (820) for assembly with the piezoelectric tube sections, the method includes mounting the fiber optic element to a jig (822) for ease of handling during processing. A fiber optic element can be cut into sections to provide fiber optic elements for use in the embodiments described herein, specifically prior to mounting. The initial sectioning can provide a fiber optic element with an initial length longer than a final length, enabling the fiber optic element to be cleaved to a final length as described more fully below. The initial length enables handling operations and can be performed with relatively low tolerances.

In some implementations, mounting of the fiber optic element can include cleaning of the fiber, including removal of plastic or other buffer coatings on exterior surfaces of the fiber optic element, for example, using an etch including a mixture of sulfuric acid ($H_2SO_4$) and hydrogen peroxide ($H_2O_2$), which can be referred to as a piranha etch. Other buffer coating removal processes can be utilized, including thermal processes or the like.

Once the fiber optic element is mounted, the fiber optic element is etched to form the desired shape (824), for example, the shape illustrated in FIG. 4. The fiber optic element is optionally metallized (826) to form an electrically conductive coating (using the first or second conductive material or a different conductive material) on the exterior surface of the fiber optic element. The first conductive material and the second conductive material can be a same material. The optional metallization can include a multilayer stack of metals, such as a chrome layer to provide adhesion and a gold layer on the chrome layer to provide high conductivity and high quality bonding to the metallization on the interior surface of the piezoelectric tube sections. Other metals can be utilized in addition to chrome and gold, including nickel, silver, platinum, titanium, combinations thereof, and the like.

Referring to process 820, the fiber optic element is cleaved (828) to achieve the final length of the fiber optic element. In some embodiments, cleaving after the optional metallization process enables the tip to be protected during processing, only exposing the tip of the fiber optic element as a final step of process 820. Similar arguments are applicable to the injection end of the fiber optic element.

As discussed above in relation to the fabrication of the piezoelectric tube sections, the individual steps illustrated in process 820 may be performed in various sequences as appropriate to the individual step, for example, cleaving (828) prior to the optional metallization process (826). One of ordinary skill in the art would recognize many variations, modifications, and alternatives.

The method also includes assembling the piezoelectric actuator by assembling the previously prepared piezoelectric tube sections to the fiber optic element (830). If the fiber optic element is not metallized, then an adhesive can be utilized to bond the piezoelectric tube sections to the fiber optic element. For cases in which the peripheral surface of the fiber optic element is metallized in optional metallization process 826, the assembly process can include a metal/metal bonding process. Although the mounting mechanism, for example, the retention collar, is included as part of process 810, this is not required by the present invention and the mounting mechanism could be added (818) after assembly of the previously prepared piezoelectric tube sections to the fiber optic element (830). Electrical connections are added (832) and additional steps are performed as needed to assemble the fiber scanner (834).

It should be appreciated that the specific steps illustrated in FIG. 8 provide a particular method of fabricating a fiber scanner according to another embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 9:
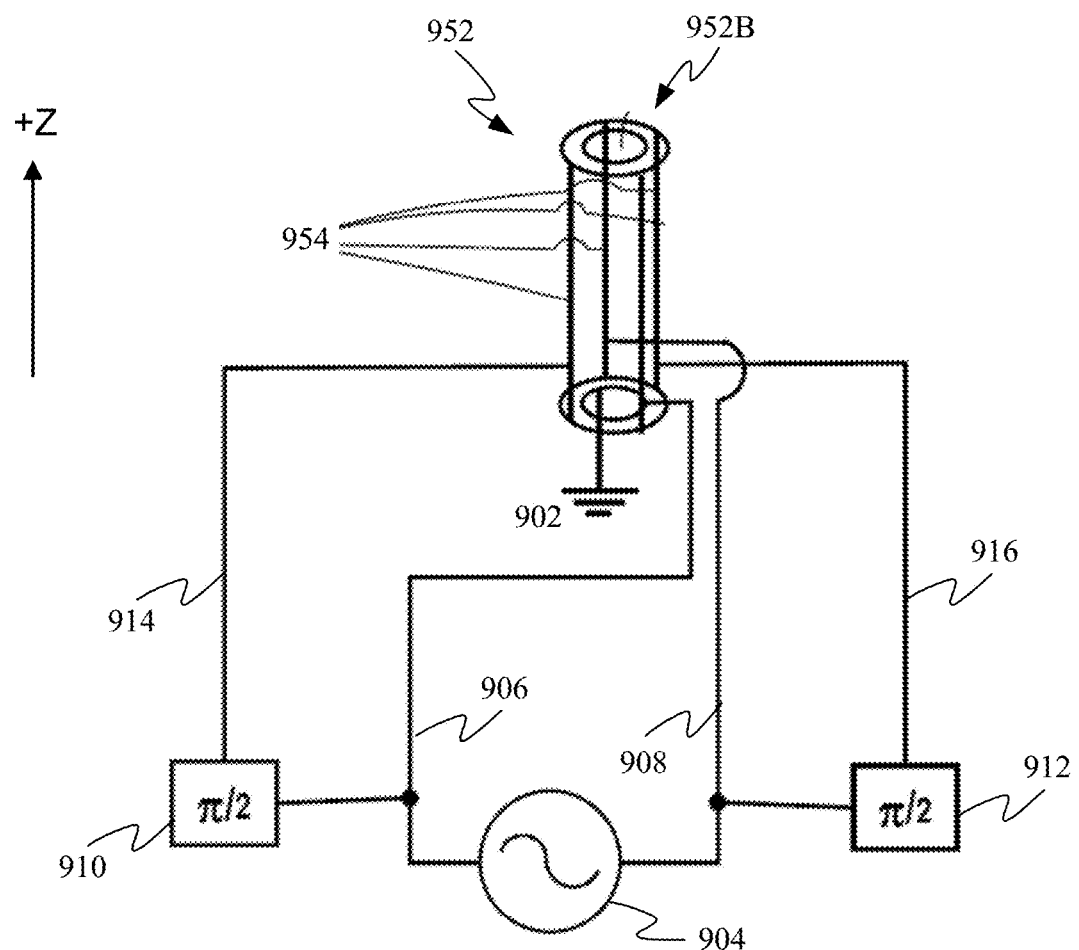
FIG. 9 shows an electrical schematic for a circuit for driving a piezoelectric motion actuator assembly as described herein.

FIG. 9 shows an electrical schematic for a circuit for driving a piezoelectric motion actuator assembly as described herein. As illustrated in FIG. 9, piezoelectric tube 952 includes multiple piezoelectric elements. Piezoelectric tube 952 can be referred to as a piezoelectric transducer or piezoelectric motion actuator. The lower portion of the piezoelectric tube 952 is attached to a fixed base, enabling the top of the structure to move in response to the electrode drive voltages. For purposes of clarity, actuation inputs 954 on the outside surfaces of the piezoelectric elements are illustrated schematically as simple lines as opposed to the strip shaped drive electrodes. The interior of the piezoelectric tube 952 is metallized and connected to ground 902. In some embodiments, four phases are applied to the actuation inputs arranged at 900 orientations with respect to each other around the outside surfaces of the piezoelectric elements. In some embodiments, a fiber optic with modulated light can extend through piezoelectric tube 952. Thus, piezoelectric tube 952 is useful not only for mechanical functionality but for light delivery as well. It will be appreciated that corrections for phase offsets can be implemented as appropriate.

Signal generator 904, which represents any source that generates signals, provides outputs that are connected to electrodes 906 and 908, which are, in turn, connected to corresponding actuation inputs (e.g., +Y, and −Y in FIG. 2). Signal generator 904 is also connected to a first 900 phase shifter 910 and a second 900 phase shifter 912, which are connected to electrodes 914 and 916, which are, in turn, connected to corresponding actuation inputs (e.g., +X and −X in FIG. 2). Thus, signal generator 904, in concert with the phase shifters, provides four signals that are 900 out of phase with respect to each other, and connected to electrodes that are spaced by 90 degrees from each other around the piezoelectric tube 952.

In operation, the field is applied radially from the actuation inputs on the outer surface of the piezoelectric element to the common grounded electrode on the inner surface of the piezoelectric element. Because the left/right and front/back actuation inputs are driven by electrodes that are 1800 out of phase, contraction of the left/front side of the piezoelectric element and expansion of the right/back side of the piezoelectric element are produced.

As the voltages applied to the four actuation inputs of each actuation input are varied as a function of time, the free end 952B of piezoelectric tube 952 can sweep out a pattern, for example, a circular, spiral, or other pattern, aligned with a longitudinal axis of piezoelectric tube 952 (i.e., the z-direction). In some embodiments, the sweep pattern can correspond to a resonant frequency of the tapered free end of a fiber extending through piezoelectric tube 952, helping to reduce an amount of energy for the sweep pattern to be maintained.

Metallization of the fiber optic element can be utilized to obviate the need for metallizing the inside of the piezoelectric tube. An advantage of metallizing the fiber optic element is that one of the electrodes utilized to actuate the piezoelectric tube, for example, a common or center electrode, can be grounded by making electrical contact to the metallized portion of the fiber optic element. Moreover, in addition to grounding of the metallized portion of the fiber optic element, a bias voltage can be applied to the metallized portion of the fiber optic element. Accordingly, by applying a bias voltage to the center electrode of the piezoelectric actuator, depoling of the piezoelectric material can be reduced or prevented. Thus, embodiments of the present invention provide not only high deflection and high Q factor as a result of the continuous bond line, but also enable one of the electrodes of the motion actuator to be formed on the outer surface of the fiber optic element as a result of the continuous bond line between the metallized fiber and the motion actuator.

As will be evident to one of skill in the art, piezoelectric materials have an asymmetric behavior with respect to depoling, which can result from applying too high of a voltage across the piezoelectric material. Since the depoling process is asymmetrical, a static voltage bias applied to the piezoelectric material can provide the ability to apply a larger peak-to-peak voltage across the piezoelectric material without depoling the piezoelectric material. Accordingly, embodiments of the present invention can utilize the bias that can be applied to the metallized portion of the fiber optic element to enable larger peak-to-peak voltages to be applied while maintaining system performance. Referring to FIG. 9, ground 902 can be replaced with a bias voltage and the other applied voltages can be adjusted with respect to the bias voltage.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A fiber scanning system comprising:
a fiber optic element having an actuation region;
a motion actuator mechanically coupled to the fiber optic element, wherein the motion actuator comprises two hemispherical elements and a continuous bond line is present between the actuation region and the motion actuator; and a retention collar mechanically coupled to the motion actuator.

2. The fiber scanning system of claim 1 wherein the actuation region is defined by an outer diameter and the motion actuator is defined by an inner diameter substantially equal to the outer diameter.

3. The fiber scanning system of claim 1 wherein the motion actuator comprises a piezoelectric actuator.

4. The fiber scanning system of claim 3 wherein the two hemispherical elements are two hemispherical piezoelectric elements disposed on opposite sides of the fiber optic element.

5. The fiber scanning system of claim 4 further comprising a first electrode electrically coupled to an interior portion of each of the two hemispherical piezoelectric elements and a plurality of second electrodes, each electrically coupled to an exterior portion of each of the two hemispherical piezoelectric elements.

6. The fiber scanning system of claim 5 further comprising a controller operable to apply a non-zero DC bias to the first electrode, a first AC voltage to one of the plurality of second electrodes and a second AC voltage to another of the plurality of second electrodes.

7. The fiber scanning system of claim 6 wherein the first AC voltage is 90 degrees out of phase with respect to the second AC voltage.

8. The fiber scanning system of claim 1, wherein the fiber optic element further comprises an extension region and a light emission region.

9. The fiber scanning system of claim 1, wherein a portion of the fiber optic element is characterized by a tapered profile.

10. The fiber scanning system of claim 1, further comprising a conductive material disposed on an interior surface and an exterior surface of each of two hemispherical elements.

11. The fiber scanning system of claim 10, further comprising a conductive coating disposed on the actuation region of the fiber optic element, wherein the interior surface of each of the two hemispherical elements is joined to the actuation region of the fiber optic element by a metal-to-metal bond.

12. The fiber scanning system of claim 1, further comprising a conductive coating disposed on the actuation region of the fiber optic element.

13. The fiber scanning system of claim 1, further comprising a conductive coating disposed on an additional portion of the fiber optic element.

14. The fiber scanning system of claim 13, wherein the addition portion of the fiber optic element comprises at least one of an extension region or a light emission tip.

15. The fiber scanning system of claim 14, wherein the additional portion of the fiber optic element is suitable for use in position sensing or motion sensing of the extension region or the light emission tip.

16. The fiber scanning system of claim 1, further comprising:
a conductive material disposed on an interior surface of each of the two hemispherical elements; and
a conductive coating disposed on an additional portion of the fiber optic element, wherein the conductive coating is electrically isolated from the conductive material disposed on the interior surface of the two hemispherical elements.

* * * * *